United States Patent
Yang et al.

(10) Patent No.: US 10,390,120 B1
(45) Date of Patent: Aug. 20, 2019

(54) VOICE ASSISTANT DEVICE CAPABLE OF BEING POWERED ON OR POWERED OFF BY RELATIVE ROTATION OF DIFFERENT MODULES AND RELATED VOICE ASSISTANT SYSTEM

(71) Applicant: Wistron Corporation, New Taipei (TW)

(72) Inventors: Chen-Pu Yang, New Taipei (TW); Ting-Yao Cheng, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/192,764

(22) Filed: Nov. 15, 2018

(30) Foreign Application Priority Data

Aug. 2, 2018 (TW) .............................. 107126873 A

(51) Int. Cl.
| | |
|---|---|
| *H04R 1/02* | (2006.01) |
| *H05K 5/03* | (2006.01) |
| *H05K 5/00* | (2006.01) |
| *G06F 3/16* | (2006.01) |
| *H04R 1/04* | (2006.01) |
| *H04R 1/40* | (2006.01) |
| *H05K 5/02* | (2006.01) |

(52) U.S. Cl.
CPC ............. *H04R 1/025* (2013.01); *G06F 3/167* (2013.01); *H04R 1/04* (2013.01); *H04R 1/406* (2013.01); *H05K 5/0021* (2013.01); *H05K 5/0247* (2013.01); *H05K 5/03* (2013.01)

(58) Field of Classification Search
CPC .......... H04R 1/025; H04R 1/04; H04R 1/406; G06F 3/167; H05K 5/0021; H05K 5/0247; H05K 5/03
See application file for complete search history.

(56) References Cited

U.S. PATENT DOCUMENTS

| | | | | |
|---|---|---|---|---|
| 9,710,024 | B2 * | 7/2017 | Kim | ........................ G06F 1/183 |
| 2018/0092233 | A1 * | 3/2018 | Ma | ........................... A45B 3/00 |
| 2018/0174584 | A1 | 6/2018 | Chih | |
| 2019/0074732 | A1 * | 3/2019 | Zeine | ..................... H02J 50/80 |

FOREIGN PATENT DOCUMENTS

TW          M434968 U1     8/2012

* cited by examiner

*Primary Examiner* — Andrew L Sniezek
(74) *Attorney, Agent, or Firm* — Winston Hsu

(57) ABSTRACT

A voice assistant device includes a first assembling module and a second assembling module. The first assembling module includes an upper cover, a power source assembly and a baseplate. The second assembling module includes a lower cover and a conductive assembly. The lower cover is detachably installed on the upper cover and rotatable relative to the upper cover. The power source assembly is electrically connected to the baseplate by the conductive assembly for providing electricity to the baseplate in response to a first condition that the lower cover is rotated relative to the upper cover to a power-on position. The power source assembly is not electrically connected to the baseplate, so as not to provide electricity to the baseplate in response to a second condition that the lower cover is rotated relative to the upper cover to a power-off position.

25 Claims, 27 Drawing Sheets

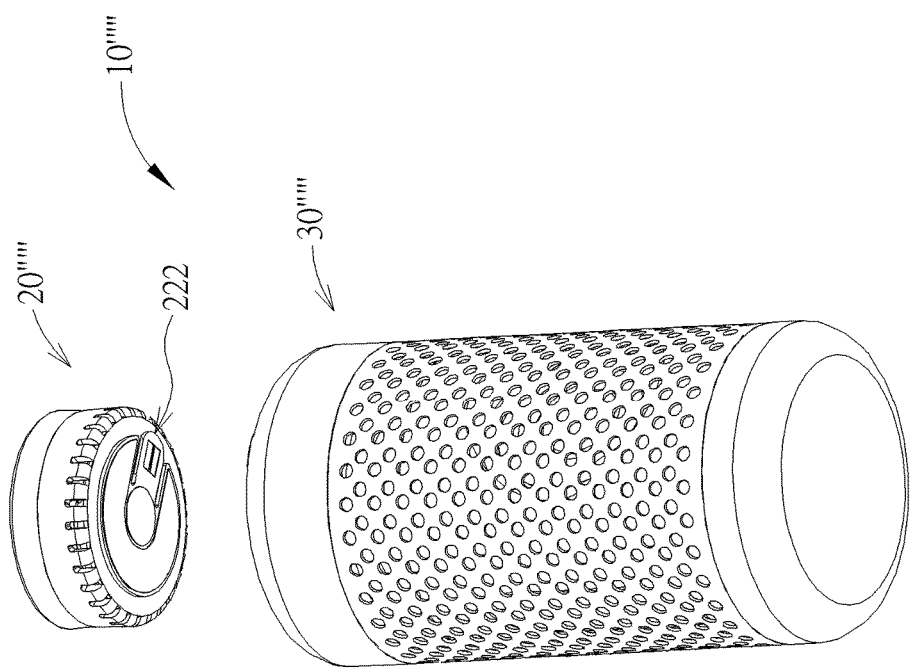

VOICE ASSISTANT DEVICE CAPABLE OF BEING POWERED ON OR POWERED OFF BY RELATIVE ROTATION OF DIFFERENT MODULES AND RELATED VOICE ASSISTANT SYSTEM

BACKGROUND OF THE DISCLOSURE

1. Field of the Disclosure

The present disclosure relates to a voice assistant device and a related voice assistant system, and more particularly, to a voice assistant device capable of being powered on or powered off by relative rotation of different modules and a related voice assistant system.

2. Description of the Prior Art

As the concept of smart homes has become more popular, there are more and more smart home products in the market. A voice assistant device provides a voice interactive interface that allows a user to control other smart home devices through voice. However, the conventional voice assistant device is usually equipped with a physical button and a lithium battery, which are respectively used as a power button and a power supply source. Since the lithium battery cannot be replaced by the user, the voice assistant device is usually configured to be incapable of being disassembled. When power of the lithium battery is exhausted, the user has to charge the lithium batteries by a plug. Therefore, it is inconvenient for portable use. Therefore, it also becomes an important topic in the field to provide a voice assistant device with expandable features and functions to increase applicability.

SUMMARY OF THE DISCLOSURE

Therefore, it is an objective to provide a voice assistant device capable of being powered on or powered off by relative rotation of different modules and a related voice assistant system for solving the aforementioned problem.

In order to achieve the aforementioned objective, the present disclosure discloses a voice assistant device capable of being powered on or powered off by relative rotation of different modules. The voice assistant device includes a first assembling module and a second assembling module. The first assembling module includes an upper cover, a power source assembly and a baseplate. The power source assembly and the baseplate are disposed on the upper cover. The second assembling module includes a lower cover and a conductive assembly disposed on the lower cover. The lower cover is detachably installed on the upper cover and rotatable relative to the upper cover. The power source assembly is electrically connected to the baseplate by the conductive assembly, so as to provide electricity for the baseplate in response to a first condition that the lower cover is rotated relative to the upper cover to a power-on position, and the power source assembly is not electrically connected to the baseplate, so as not to provide the electricity for the baseplate in response to a second condition that the lower cover is rotated relative to the upper cover to a power-off position.

In order to achieve the aforementioned objective, the present disclosure further discloses a voice assistant system including a voice assistant device and an extension accessory. The voice assistant device includes a first assembling module and a second assembling module. The first assembling module includes an upper cover, a power source assembly and a baseplate. The power source assembly and the baseplate are disposed on the upper cover. The second assembling module includes a lower cover and a conductive assembly disposed on the lower cover. The lower cover is detachably installed on the upper cover and rotatable relative to the upper cover. The power source assembly is electrically connected to the baseplate by the conductive assembly, so as to provide electricity for the baseplate in response to a first condition that the lower cover is rotated relative to the upper cover to a power-on position, and the power source assembly is not electrically connected to the baseplate, so as not to provide the electricity for the baseplate in response to a second condition that the lower cover is rotated relative to the upper cover to a power-off position. The extension accessory is detachably installed on the voice assistant device. The extension accessory is electrically connected to the voice assistant device to provide a corresponding extension function for the voice assistant device when the extension accessory is installed on the voice assistant device.

In summary, the voice assistant device of the present disclosure can be powered on or powered off by relative rotation of the first assembling module and the second assembling module. When the lower cover is rotated relative to the upper cover to the power-on position, the power source assembly is electrically connected to the baseplate by the conductive assembly, so as to provide the electricity for the baseplate to switch the voice assistant device to a power-on state. When the lower cover is rotated relative to the upper cover to the power-off position, the power source assembly is not electrically connected to the baseplate, so as not to provide the electricity for the baseplate to switch the voice assistant device to a power-off state, which facilitates a user to detach the first assembling module and the second assembling module from each other for maintenance, such as battery replacement. Therefore, it brings convenience in use. Furthermore, the voice assistant device of the present disclosure can be combined with the extension accessory to form the voice assistant system. When the extension accessory is installed on the voice assistant device, the extension accessory is electrically connected to the voice assistant device to provide the corresponding extension function, such as a power supply function, a light sensing function or a smoke sensing function for the voice assistant device. In other words, the voice assistant system with such modular design can satisfy different use demands by installing different extension accessories with different extension functions on the voice assistant device. Therefore, it is flexible in use.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

FIG. 26 and FIG. 27 are partial exploded diagrams of a voice assistant system at different views according to a sixth embodiment of the present disclosure.

DETAILED DESCRIPTION

In the following detailed description of the preferred embodiments, reference is made to the accompanying drawings which form a part hereof, and in which is shown by way of illustration specific embodiments in which the disclosure may be practiced. In this regard, directional terminology, such as "top," "bottom," "front," "back," etc., is used with reference to the orientation of the Figure(s) being described. The components of the present disclosure can be positioned in a number of different orientations. As such, the directional terminology is used for purposes of illustration and is in no way limiting. Accordingly, the drawings and descriptions will be regarded as illustrative in nature and not as restrictive.

Figure 1:
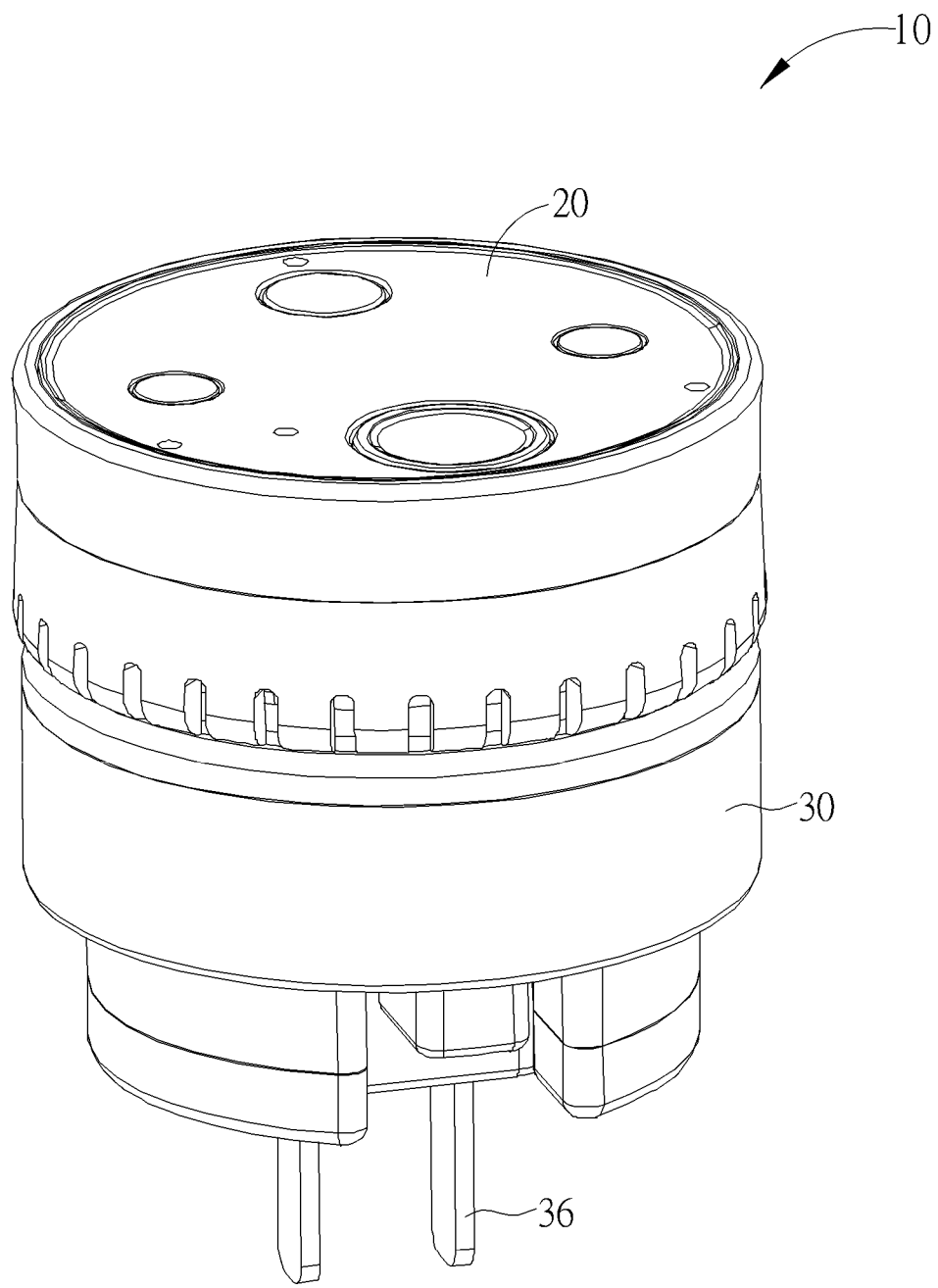
FIG. 1 is a schematic diagram of a voice assistant system according to a first embodiment of the present disclosure.
Figure 2:
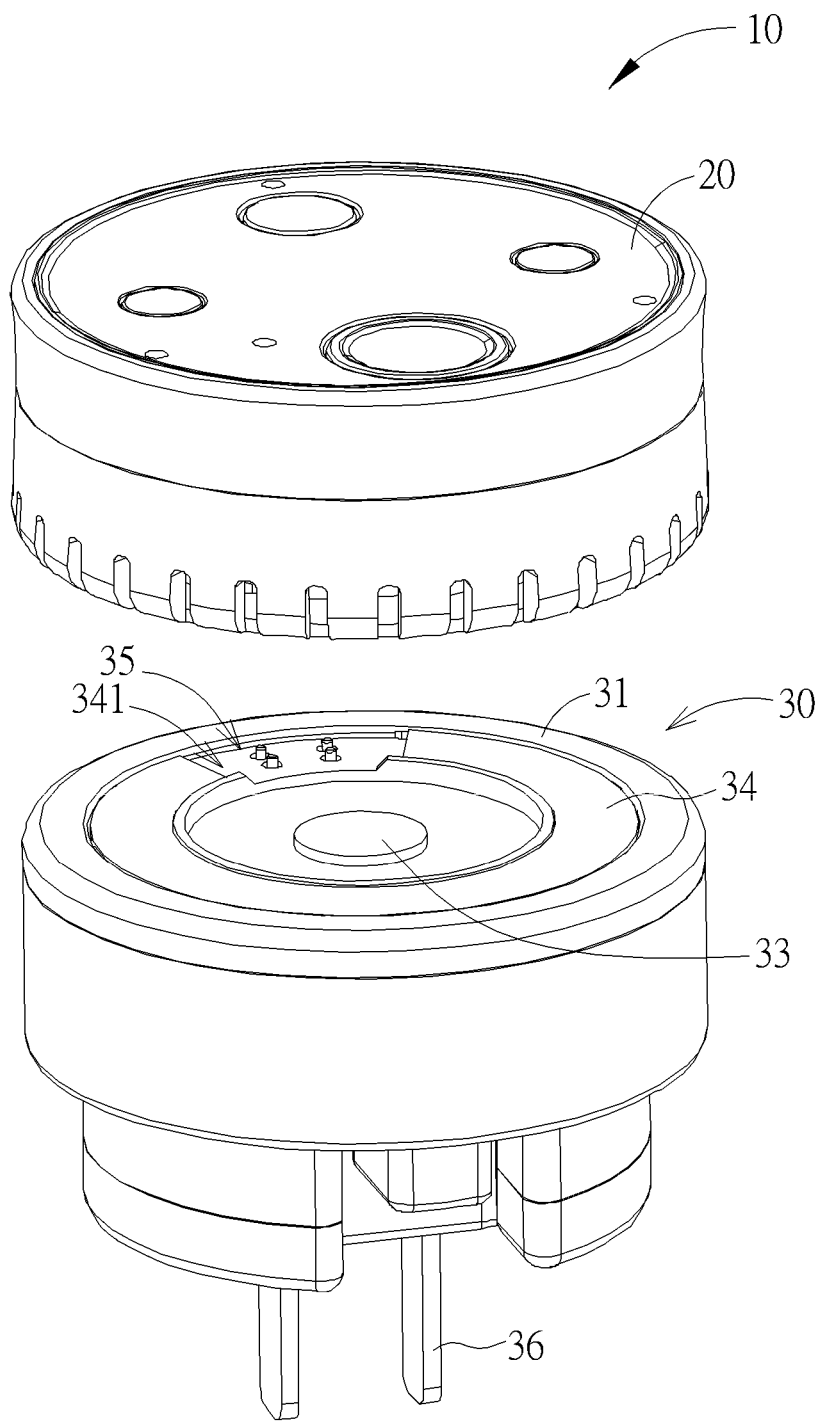
FIG. 2 is an exploded diagram of the voice assistant system according to the first embodiment of the present disclosure.

Please refer to FIG. 1 and FIG. 2. FIG. 1 is a schematic diagram of a voice assistant system 10 according to a first embodiment of the present disclosure. FIG. 2 is an exploded diagram of the voice assistant system 10 according to the first embodiment of the present disclosure. As shown in FIG. 1 and FIG. 2, the voice assistant system 10 of the present disclosure can be used for providing a voice interactive interface to allow a user to control other smart home devices through voice. In order to satisfy different use demands, the voice assistant system 10 has a modular design and includes a voice assistant device 20 and at least one extension accessory 30. The voice assistant device 20 may be used independently. In order to bring convenience for portable use, the voice assistant device 20 can use at least one commercially available dry-cell battery instead of a lithium battery as a power supply source, which allows the user to replace the dry-cell battery for extending operating time of the voice assistant system 10. The extension accessory 30 is detachably installed on the voice assistant device 20. When the extension accessory 30 is installed on the voice assistant device 20, the extension accessory 30 is electrically connected to the voice assistant device 20 for providing a corresponding extension function for the voice assistant device 20. In this embodiment, the extension accessory 30 may be a power supply accessory. When the power supply accessory is installed on the voice assistant device 20 and connected to an external power source, the voice assistant device 20 can be charged by the external power source through the power supply accessory. However, it is not limited thereto. For example, the extension accessory 30 also may be a night light accessory including a light sensing module, which is capable of detecting environmental luminance for providing light corresponding to the environmental luminance. Furthermore, the extension accessory 30 also may be an alert accessory including a smoke sensing module, which is capable of detecting environmental smoke for providing an alert function as a fire alarm. When the night light accessory or the alert accessory is installed on the voice assistant device 20, the voice assistant device 20 can provide electricity for the night light accessory or the alert accessory.

Figure 3:
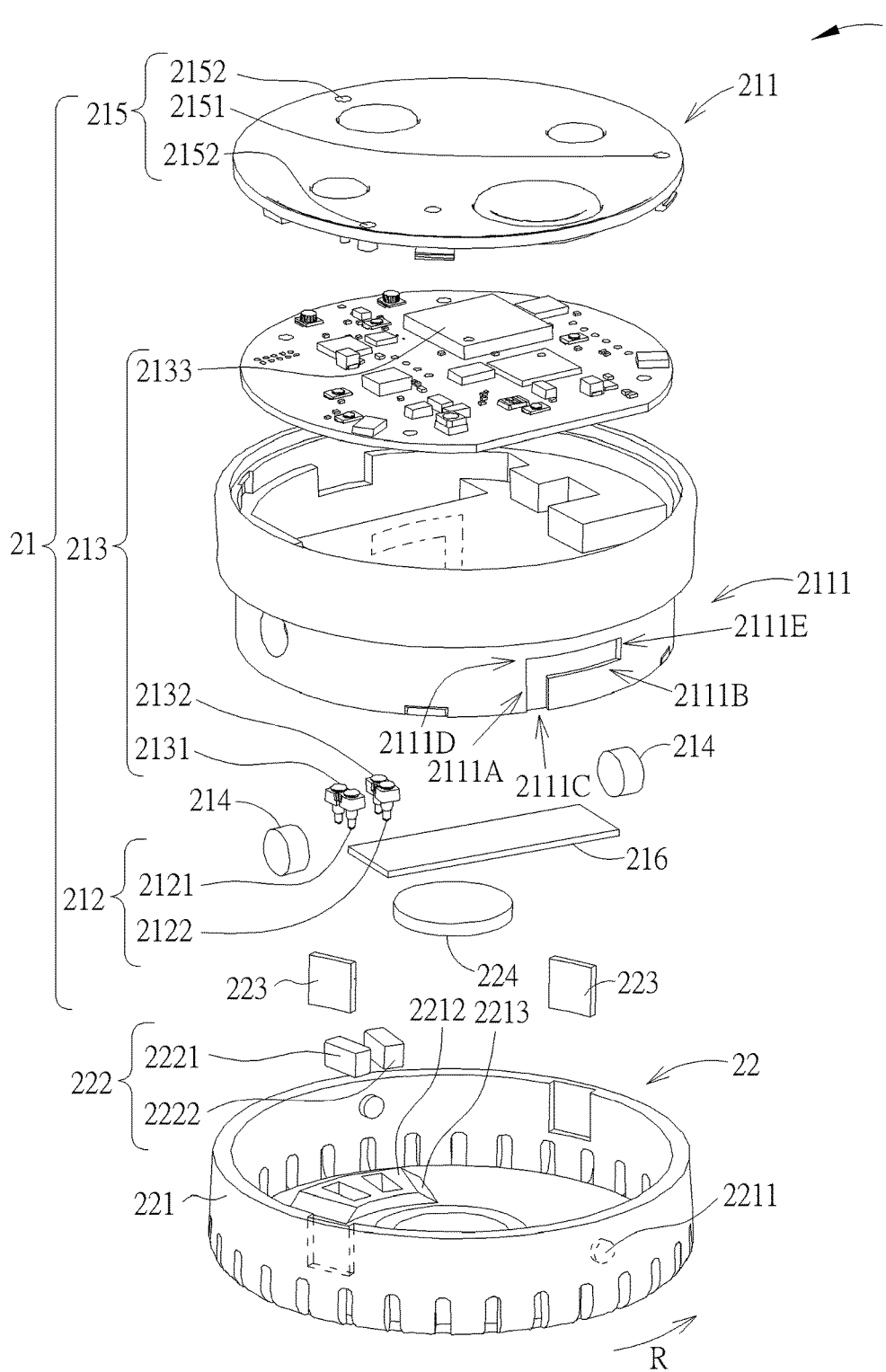
FIG. 3 and FIG. 4 are exploded diagrams of a voice assistant device at different views according to the first embodiment of the present disclosure.
Figure 4:
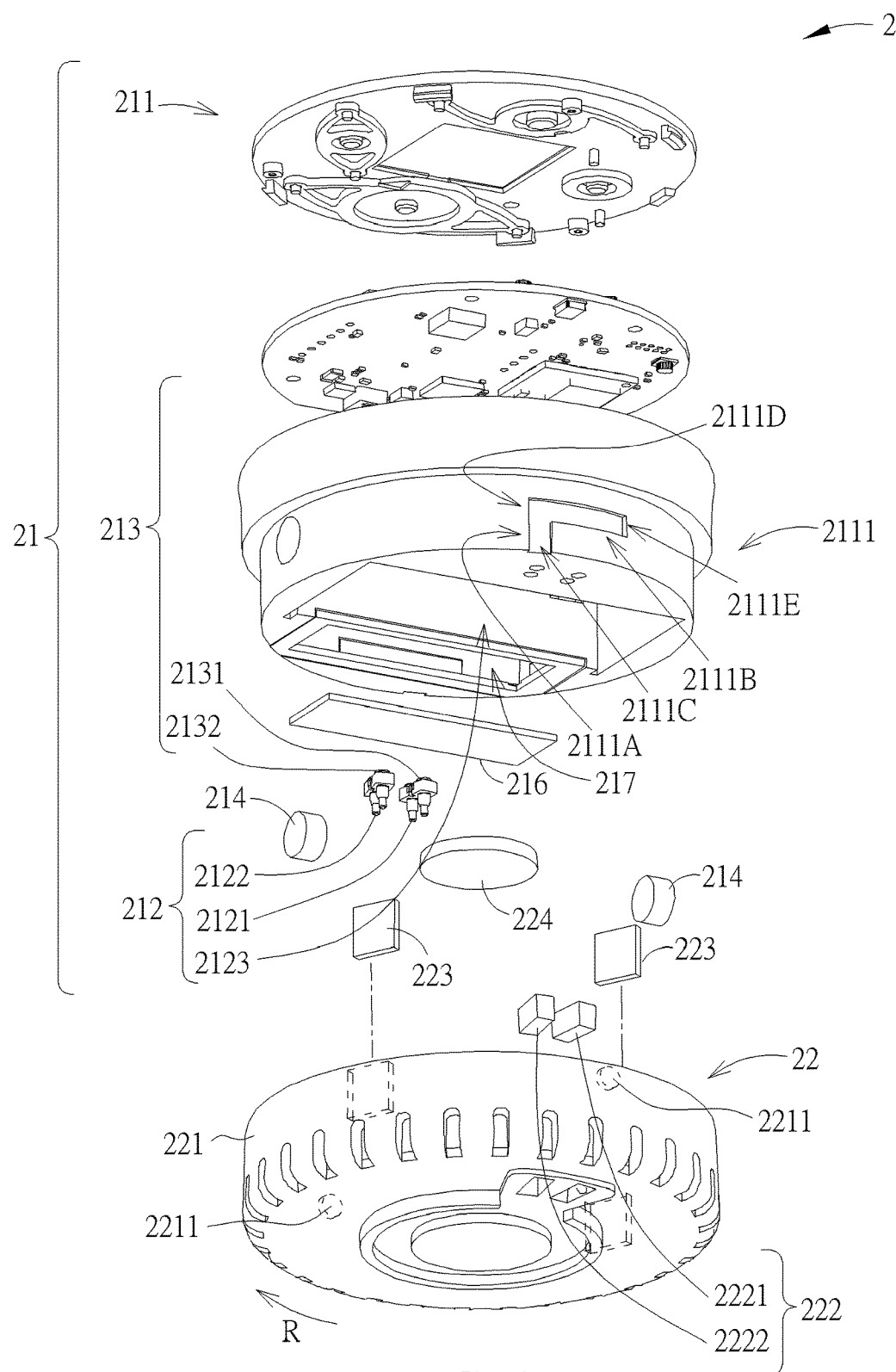
Figure 5:
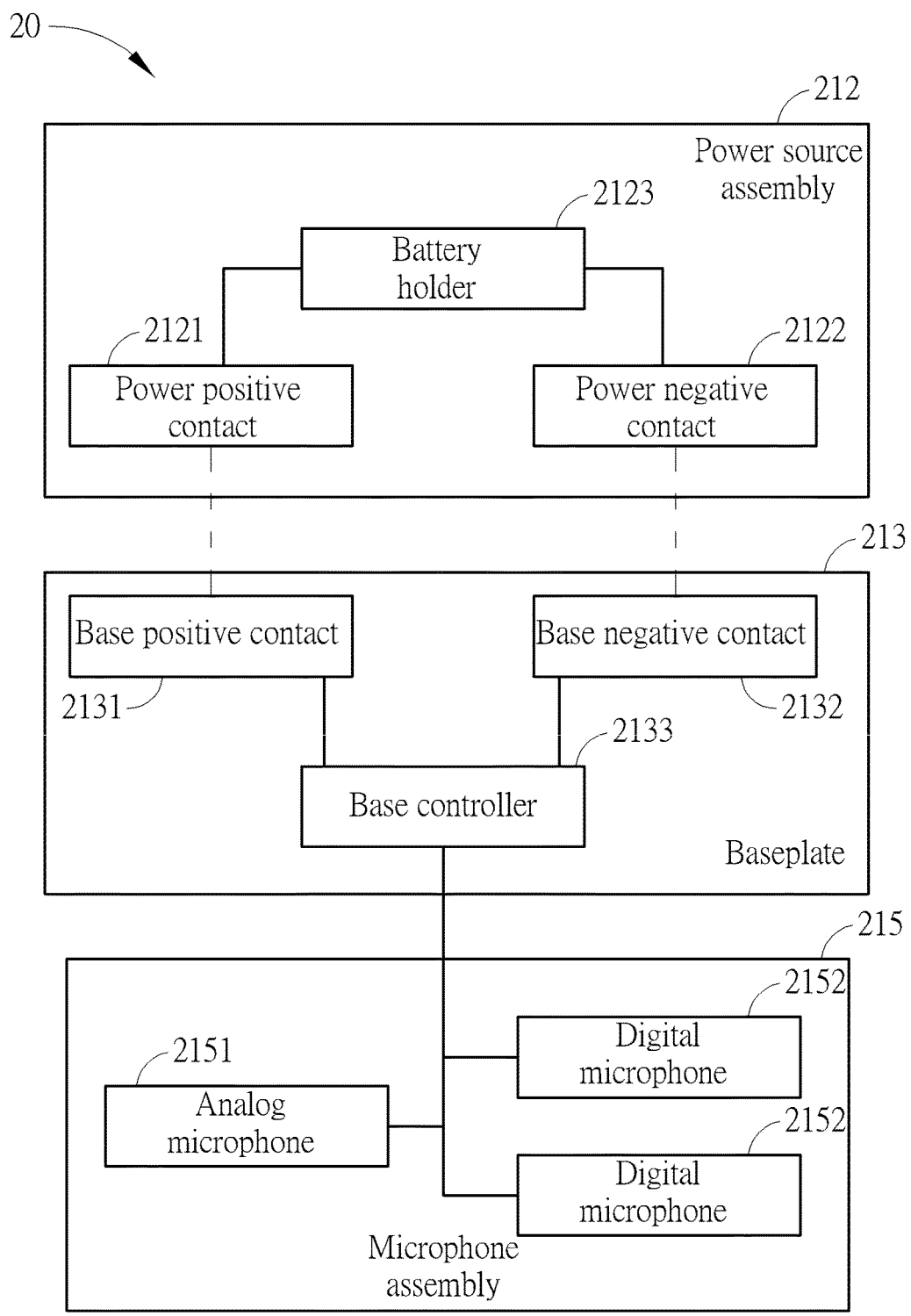
FIG. 5 is a partial functional block diagram of the voice assistant device according to the first embodiment of the present disclosure.

Please refer to FIG. 3 to FIG. 5. FIG. 3 and FIG. 4 are exploded diagrams of the voice assistant device 20 at different views according to the first embodiment of the present disclosure. FIG. 5 is a partial functional block diagram of the voice assistant device 20 according to the first embodiment of the present disclosure. As shown in FIG. 3 to FIG. 5, the voice assistant device 20 includes a first assembling module 21 and a second assembling module 22. The first assembling module 21 includes an upper cover 211, a power source assembly 212, a baseplate 213, two first positioning magnetic components 214, a microphone assembly 215 and a speaker assembly 216. The power source assembly 212, the baseplate 213, the two first positioning magnetic components 214 and the microphone assembly 215 are disposed on the upper cover 211. The microphone assembly 215 may include an analog microphone 2151 and two digital microphones 2152. The analog microphone 2151 and the two digital microphones 2152 may be arranged in a regular triangle configuration. The power source assembly 212 includes a power positive contact 2121, a power negative contact 2122 and a battery holder 2123. The power positive contact 2121 and the power negative contact 2122 are electrically connected to the battery holder 2123 and exposed out of a side of the upper cover 211 adjacent to the second assembling module 22. The baseplate 213 includes a base positive contact 2131, a base negative contact 2132 and a base controller 2133. The base positive contact 2131 and the base negative contact 2132 are electrically connected to the base controller 2133 and exposed out of the side of the upper cover 211 adjacent to the second assembling module 22. In this embodiment, the battery holder 2123 may be designed for accommodating two AAA batteries, and a length of a side of the regular triangle enclosed by the analog microphone 2151 and the two digital microphones 2152 may be 44.82 millimeters which is designed according to a size of the battery holder 2123. Furthermore, in this embodiment, in order to reduce power consumption, the voice assistant device 20 can be configured to use the analog microphone 2151 only to receive a voice signal when the voice assistant device 20 is in a standby state, and the base controller 2133 can activate the two digital microphones 2152 to receive voice commands by the analog microphone 2151 and the two digital microphones 2152 together when a strength of the voice signal received by the analog microphone 2151 in the standby state is greater than a threshold strength. In other words, the user can wake up the voice assistant device 20 through voice. Besides, in this embodiment, the base controller 2133 may be a microprocessor, a micro control unit (MCU), a digital signal processor (DSP) or any other processing component. However, it is not limited thereto.

The second assembling module 22 includes a lower cover 221, a conductive assembly 222, two second positioning magnetic components 223 and a first connecting magnetic component 224. The conductive assembly 222, the two second positioning magnetic components 223 and the first connecting magnetic component 224 are disposed on the lower cover 221. The lower cover 221 is detachably installed on the upper cover 211 and rotatable relative to the upper cover 211. The two second positioning magnetic components 223 can be used for magnetically attracting the two first positioning magnetic components 214 to facilitate to position the upper cover 211 relative to the lower cover 221. The first connecting magnetic component 224 is used for magnetically attaching the voice assistant device 20 onto a work surface or the extension accessory 30. Furthermore, the conductive assembly 222 includes a positive conductive component 2221 and a negative conductive component 2222. When the lower cover 221 is rotated relative to the upper cover 211 to a power-on position, the power source assembly 212 is electrically connected to the baseplate 213 by the conductive assembly 222, so as to provide the electricity for the baseplate 213 to switch the voice assistant device 20 to a power-on state. When the lower cover 221 is rotated relative to the upper cover 211 to a power-off position, the power source assembly 212 is not electrically connected to the baseplate 213 by the conductive assembly 222, so as not to provide the electricity for the baseplate 213 to switch the voice assistant device 20 to a power-off state.

Specifically, two L-shaped recesses 2111 are formed on the upper cover 211, and two protrusions 2211 protrude from the lower cover 221. Each of the two L-shaped recesses 2111 includes a first segment 2111A, a second segment 2111B, an open end 2111C, a turning end 2111D and an abutting end 2111E. The first segment 2111A is communicated with the open end 2111C and the turning end 2111D. The first segment 2111A extends along a direction substantially perpendicular to a rotating direction R of the lower cover 221 relative to the upper cover 211. The second segment 2111B is communicated with the turning end 2111D and the abutting end 2111E. The second segment 2111B extends along a direction substantially parallel to the rotating direction R of the lower cover 221 relative to the upper cover 211. The lower cover 221 is detachably installed on the upper cover 211 and rotatable relative to the upper cover 211 by cooperation of the two protrusions 2211 and the two L-shaped recesses 2111.

Figure 6:
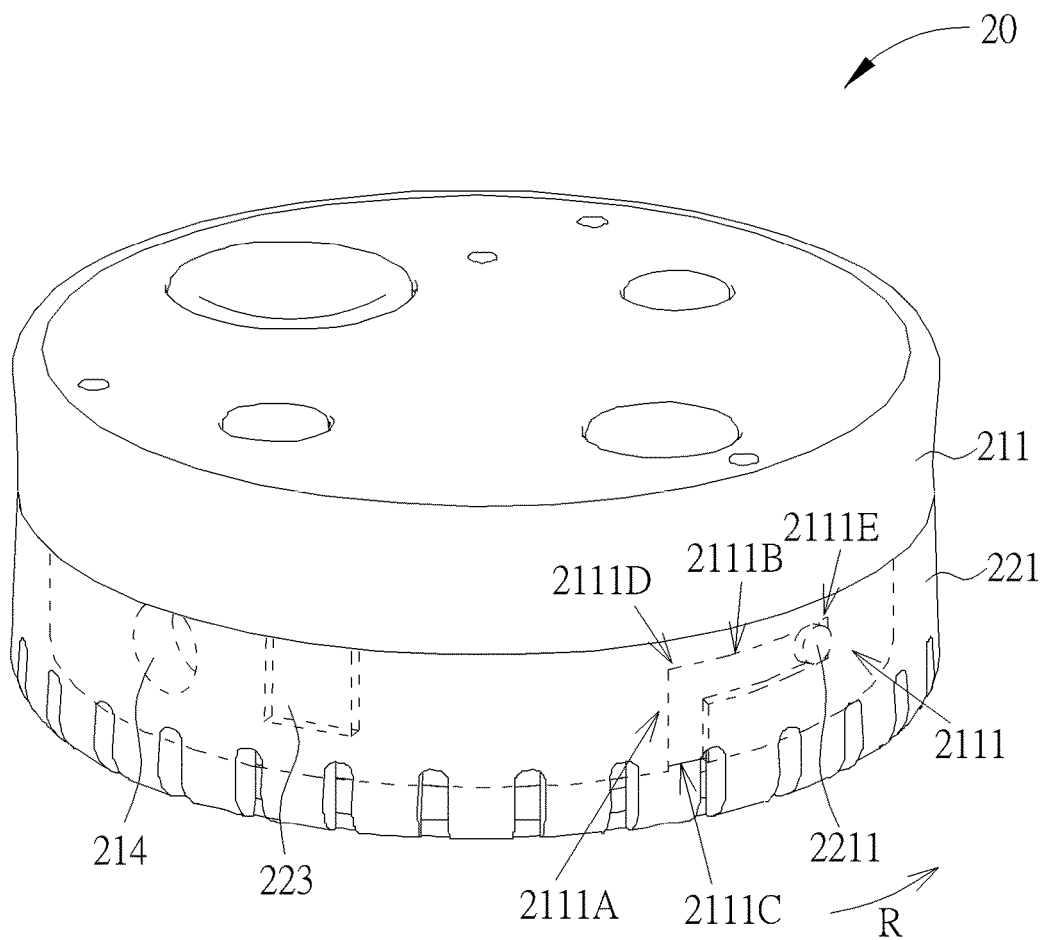
FIG. 6 and FIG. 7 are partial diagrams of the voice assistant device in a power-on state at different views according to the first embodiment of the present disclosure.
Figure 7:
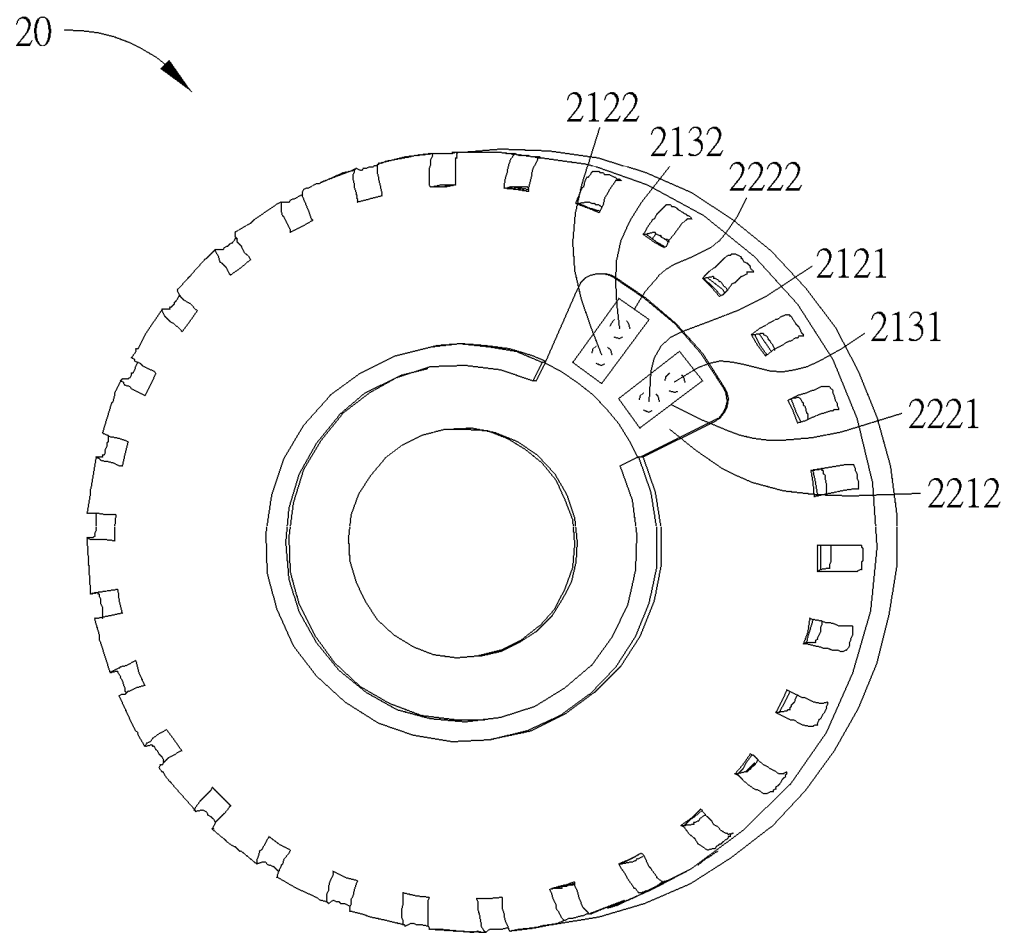

Please refer to FIG. 6 and FIG. 7. FIG. 6 and FIG. 7 are partial diagrams of the voice assistant device 20 in the power-on state at different views according to the first embodiment of the present disclosure. As shown in FIG. 6, when it is desired to install the lower cover 221 on the upper cover 211 and then rotate the lower cover 221 relative to the upper cover 211 along the rotating direction R to the power-on position, the lower cover 221 can be operated to drive each of the two protrusions 2211 to enter the corresponding L-shaped recess 2111 from the corresponding open end 2111C to the corresponding turning end 2111D via the corresponding first segment 2111A and then move within the corresponding L-shaped recess 2111 from the corresponding turning end 2111D to the corresponding abutting end 2111D via the corresponding second segment 2111B. At this moment, as shown in FIG. 7, the positive conductive component 2221 contacts with the power positive contact 2121 as well as the base positive contact 2131, and the negative conductive component 2222 contacts with the power negative contact 2122 as well as the base negative contact 2132, so that the power source assembly 212 is electrically connected to the baseplate 213, so as to provide the electricity for the baseplate 213 to switch the voice assistant device 20 to the power-on state.

Figure 8:
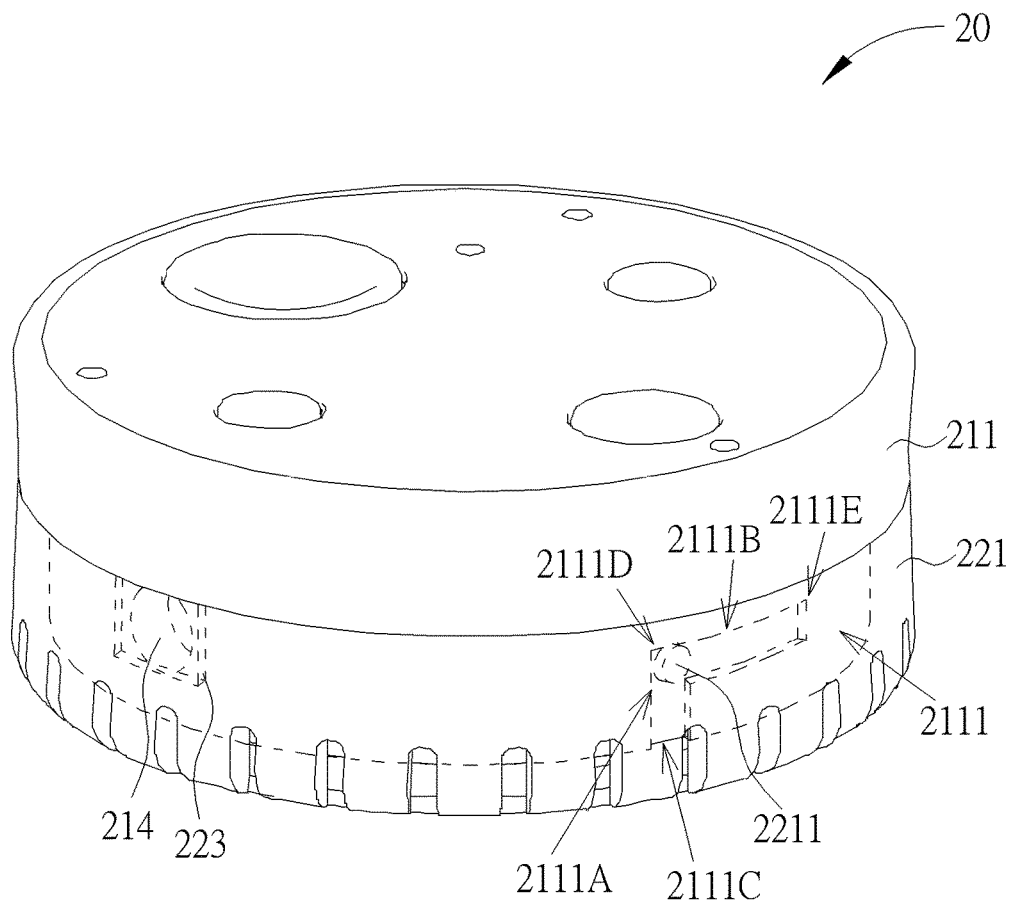
FIG. 8 and FIG. 9 are partial diagrams of the voice assistant device in a power-off state at different views according to the first embodiment of the present disclosure.
Figure 9:
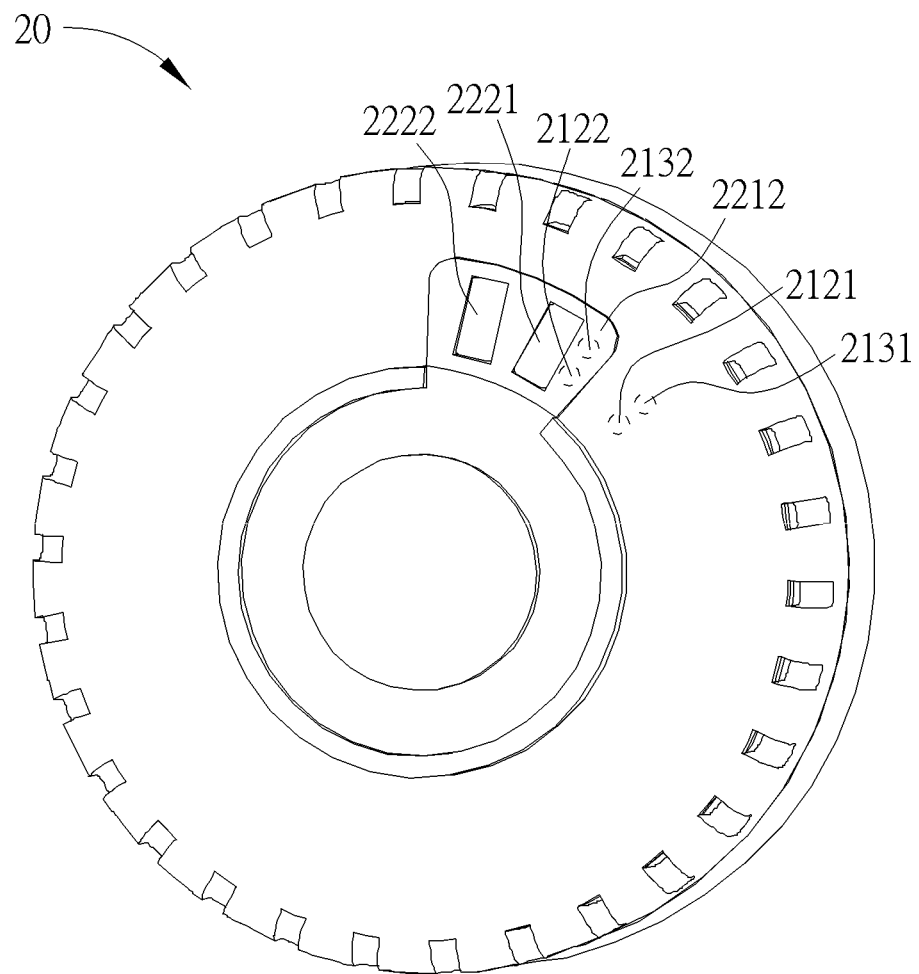

Please refer to FIG. 8 and FIG. 9. FIG. 8 and FIG. 9 are partial diagrams of the voice assistant device 20 in the power-off state at different views according to the first embodiment of the present disclosure. As shown in FIG. 8, when it is desired to rotate the lower cover 221 relative to the upper cover 211 along another rotating direction opposite to the rotating direction R to the power-off position, the lower cover 221 can be operated to drive each of the two protrusions 2211 to move within the corresponding L-shaped recess 2111 from the corresponding abutting end 2111E to the corresponding turning end 2111D via the corresponding second segment 2111B. At this moment, as shown in FIG. 8, the two first positioning magnetic components 214 and the two second positioning magnetic components 223 are aligned with each other and magnetically attract each other for positioning the upper cover 211 relative to the lower cover 221. Furthermore, as shown in FIG. 9, the positive conductive component 2221 does not contact with the power positive contact 2121 as well as the base positive contact 2131, and the negative conductive component 2222 does not contact with the power negative contact 2122 as well as the base negative contact 2132. Therefore, the power source assembly 212 is not electrically connected to the baseplate 213, so as not to provide the electricity for the baseplate 213 to switch the voice assistant device 20 to the power-off state. Besides, when the voice assistant device 20 is in the power-off state, each of the two protrusions 2211 is located at the turning end 2111D of the corresponding L-shaped recess 2111. Therefore, as long as the lower cover 221 is operated to drive each of the two protrusions 2211 to move from the turning end 2111D toward the open end 2111C via the first segment 2111A to leave from the corresponding L-shaped recess 2111, the lower cover 221 can be detached from the upper cover 211 for maintenance, such as battery replacement. After completion of the maintenance, it only has to install the lower cover 221 on the upper cover 211 and rotate the lower cover 221 relative to the upper cover 211 to the power-on position, as shown in FIG. 6, to drive each of the two protrusions 2211 to move within the corresponding L-shaped recess 2111 from the corresponding open end 2111C to the corresponding abutting end 2111E via the corresponding turning end 2111D, so as to switch the voice assistant device 20 to the power-on state.

It should be noticed that, in this embodiment, as shown in FIG. 7, when the lower cover 221 is located at the power-off position relative to the upper cover 211, the positive conductive component 2221 does not contact with the power positive contact 2121 as well as the base positive contact 2131, and the negative conductive component 2222 does not contact with the power negative contact 2122 as well as the base negative contact 2132. However, it is not limited thereto. That is, any configuration which can prevent the power positive contact 2121 and the power negative contact 2122 from being respectively electrically connected to the base positive contact 2131 and base negative contact 2132 simultaneously as the lower cover 221 is located at the power-off position relative to the upper cover 211 is included within the scope of the present disclosure. For example, in another embodiment, when the lower cover 221 is located at the power-off position relative to the upper cover 211, the positive conductive component 2221 may only contact one of the power positive contact 2121 and the base positive contact 2131, so that the power positive contact 2121 cannot be electrically connected to the base positive contact 2131 by the positive conductive component 2221. Furthermore, the negative conductive component 2222 also may only contact one of the power negative contact 2122 and the base negative contact 2132, so that the power negative contact 2122 cannot be electrically connected to the base negative contact 2132 by the negative conductive component 2222. Alternatively, in another embodiment, when the lower cover 221 is located at the power-off position relative to the upper cover 211, the positive conductive component 2221 may only contact one or none of the power positive contact 2121 and the base positive contact 2131, so that the power positive contact 2121 cannot be electrically connected to the base positive contact 2131 by the positive conductive component 2221. In this embodiment, it is not concerned with whether the negative conductive component 2222 contacts with the power negative contact 2122 and/or the base negative contact 2132. Alternatively, in another embodiment, when the lower cover 221 is located at the power-off position relative to the upper cover 211, the negative conductive component 2222 may only contact one or none of the power negative contact 2122 and the base negative contact 2132, so that the power negative contact 2122 cannot be electrically connected to the base negative contact 2132 by the negative conductive component 2222. In this embodiment, it is not concerned with whether the positive conductive component 2221 contacts with the power positive contact 2121 and/or the base positive contact 2131. It depends on practical demands.

Furthermore, as shown in FIG. 3, FIG. 7 and FIG. 9, in this embodiment, in order to provide a touch feeling for the user to be aware of that the power positive contact 2121 and the power negative contact 2122 are respectively electrically connected to the base positive contact 2131 and the base negative contact 2132 by the positive conductive component 2221 and the negative conductive component 2222, each of the power positive contact 2121, the power negative contact 2122, the base positive contact 2131 and the base negative contact 2132 may be a pogo pin. A platform 2212 protrudes from the lower cover 221. A chamfer part 2213 is formed on an outer periphery of the platform 2122. The positive conductive component 2221 and the negative conductive component 2222 are disposed on the platform 2212. In such a way, during the process of the lower cover 221 being rotated relative to the upper cover 211 along the rotating direction R from the power-off position, as shown in FIG. 9 to the power-on position, as shown in FIG. 7, the power positive contact 2121 and the base positive contact 2131 cross over the chamfer part 2213 to contact with the positive conductive component 2221, so that the power positive contact 2121 and the base positive contact 2131 are pressed by the positive conductive component 2221 to retract. Afterwards, the power negative contact 2122 and the base negative contact 2132 cross over the chamfer part 2213 to contact with the negative conductive component 2222, so that the power negative contact 2122 and the base negative contact 2132 are pressed by the negative conductive component 2222 to retract.

Figure 10:
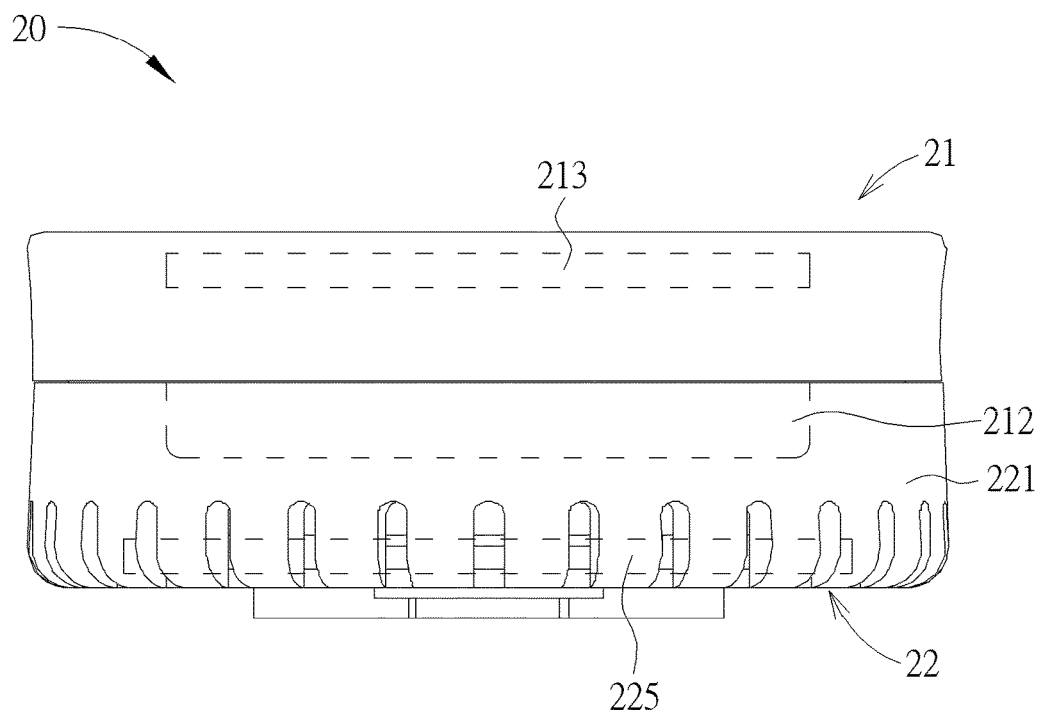
FIG. 10 is a partial internal structural diagram of the voice assistant device according to another embodiment of the present disclosure.

Besides, as shown in FIG. 4, in this embodiment, the speaker assembly 216 may be preferably a single magnetic speaker unit. A chamber 217 is formed on the upper cover 211. The speaker assembly 216 is disposed inside the chamber 217. However, the type and the configuration of the speaker assembly of the present disclosure are not limited thereto. For example, please refer to FIG. 10. FIG. 10 is a partial internal structural diagram of the voice assistant device 20 according to another embodiment of the present disclosure. As shown in FIG. 10, in this embodiment, the speaker assembly 216 may be omitted. The second assembling module 22 may further include another speaker assembly 225 disposed on the lower cover 221. In this embodiment, the speaker assembly 225 may be preferably a ceramic speaker. When the voice assistant device 20 is magnetically attached on a work surface, the work surface can resonate with the ceramic speaker to output sound. Alternatively, in another embodiment, the voice assistant device 20 may include the speaker assembly 216 and the speaker assembly 225 which are respectively disposed on the upper cover 211 and the lower cover 221 and have different resonating frequencies. It depends on practical demands.

Figure 11:
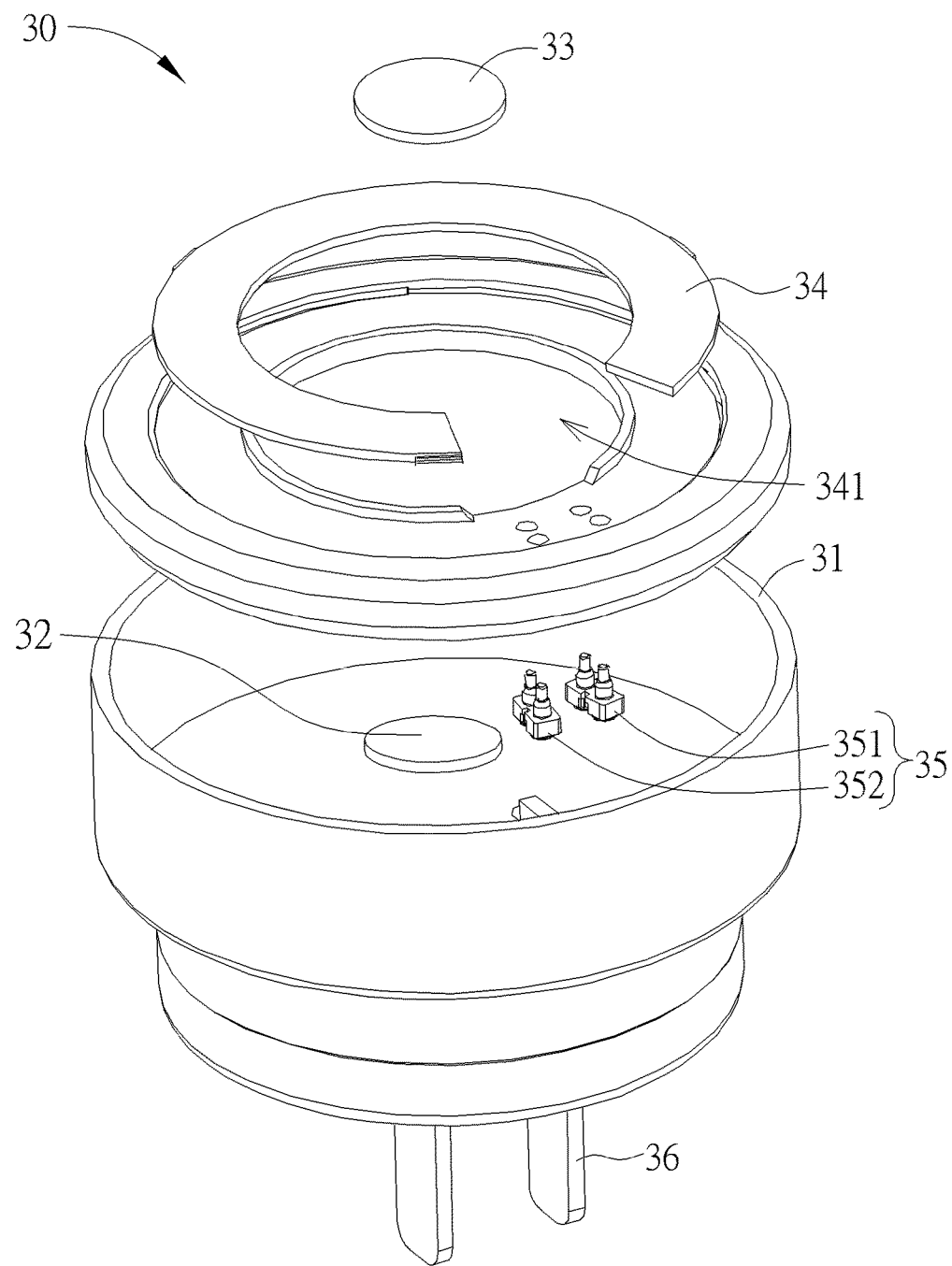
FIG. 11 is a partial exploded diagram of an extension accessory according to the first embodiment of the present disclosure.
Figure 12:
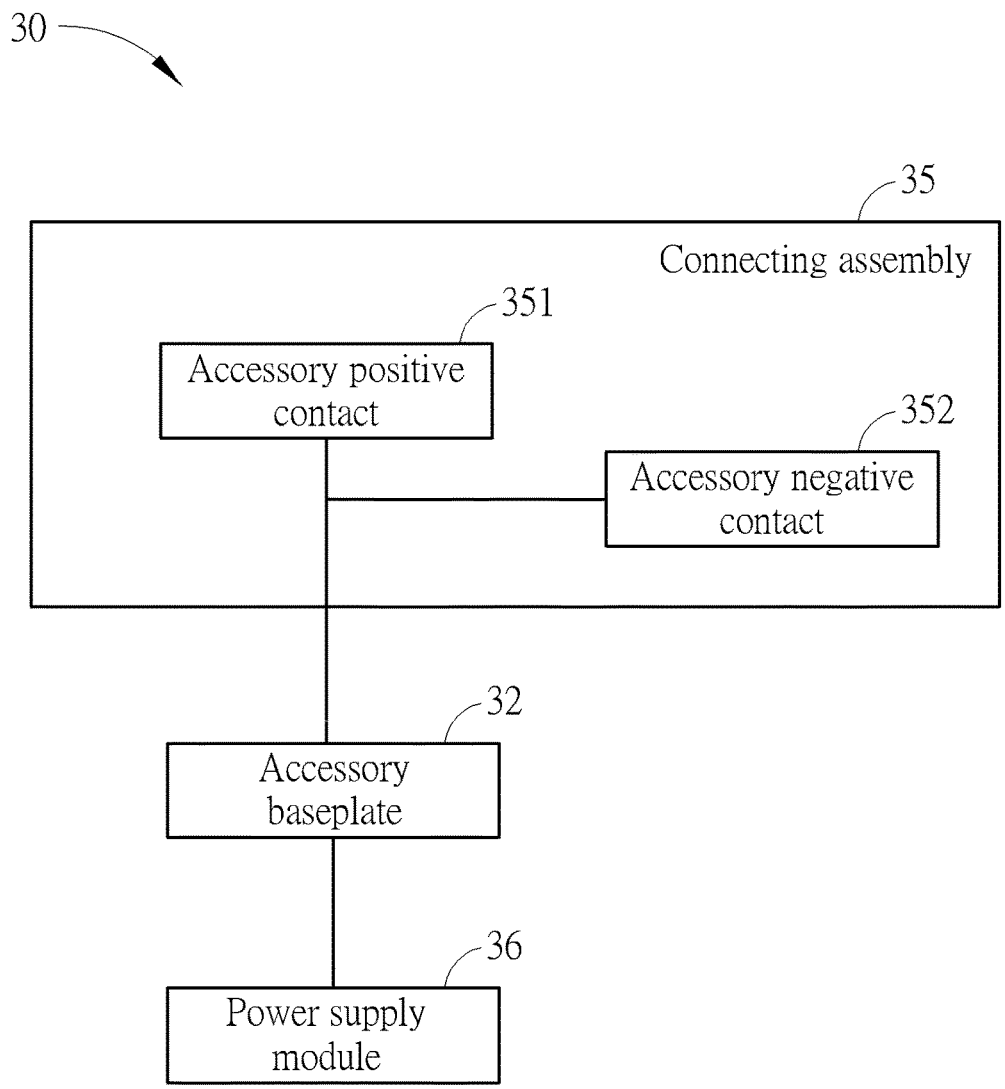
FIG. 12 is a partial functional block diagram of the extension accessory according to the first embodiment of the present disclosure.
Figure 13:
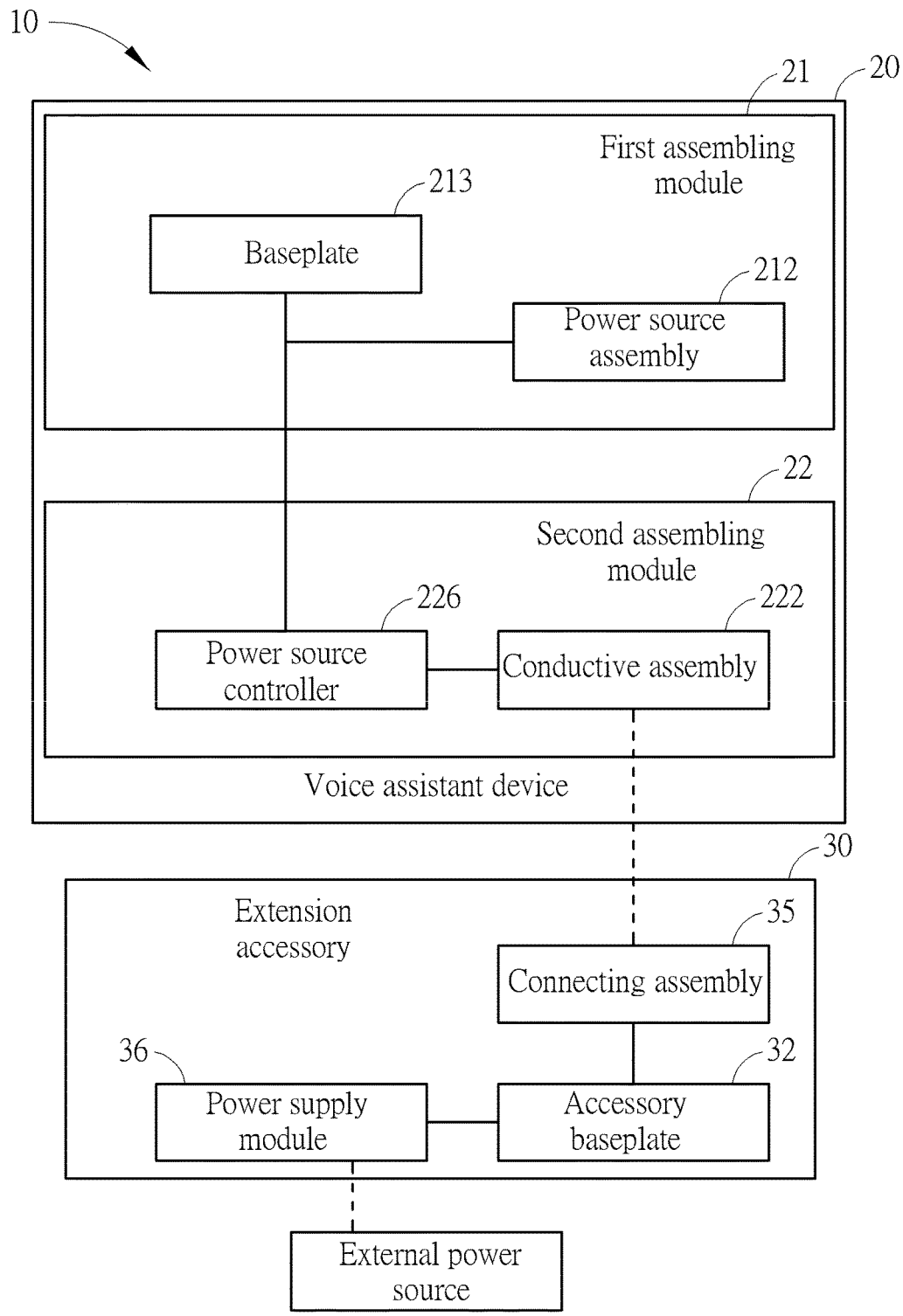
FIG. 13 is a partial functional block diagram of the voice assistant system according to the first embodiment of the present disclosure.

Please further refer to FIG. 1, FIG. 2 and FIG. 11 to FIG. 13. FIG. 11 is a partial exploded diagram of the extension accessory 30 according to the first embodiment of the present disclosure. FIG. 12 is a partial functional block diagram of the extension accessory 30 according to the first embodiment of the present disclosure. FIG. 13 is a partial functional block diagram of the voice assistant system 10 according to the first embodiment of the present disclosure. As shown in FIG. 1, FIG. 2 and FIG. 11 to FIG. 13, the extension accessory 30 includes an accessory shell 31, an accessory baseplate 32, a second connecting magnetic component 33, a protecting cover 34, a connecting assembly 35 and a power supply module 36. The accessory shell 31 is detachably installed on the lower cover 221 of the voice assistant device 20. The accessory baseplate 32, the second connecting magnetic component 33, the protecting cover 34, the connecting assembly 35 and the power supply module 36 are disposed on the accessory shell 31. The power supply module 36 is electrically connected to the accessory baseplate 32. The second assembling module 22 further includes a power source controller 226 electrically connected to the conductive assembly 222, the baseplate 213 and the power source assembly 212. When the power source controller 226 determines that the baseplate 213 is electrically connected to an external power source by the conductive assembly 222, the accessory baseplate 32 and the power supply module 36, the power source controller 226 controls the baseplate 213 to receive the electricity from the external source for providing other internal components with the electricity. In this embodiment, the power source controller 226 may be a microprocessor, a micro control unit (MCU), a digital signal processor (DSP) or any other processing component. However, it is not limited thereto.

The second connecting magnetic component 33 is for magnetically attracting the first connecting magnetic component 224 when the accessory shell 31 of the extension accessory 30 is installed on the lower cover 221 of the voice assistant device 20. The connecting assembly 35 includes an accessory positive contact 351 and an accessory negative contact 352. The accessory positive contact 351 and the accessory negative contact 352 are exposed out of the accessory shell 31 and electrically connected to the accessory baseplate 32. The protecting cover 35 is rotatably disposed on the accessory shell 31. When the accessory shell 31 is installed on the lower cover 221 and rotated relative to the lower cover 221, the lower cover 221 drives the protecting cover 34 to rotate relative to the accessory shell 31 for selectively revealing or concealing the accessory positive contact 351 and the accessory negative contact 352 of the connecting assembly 35. Specifically, in this embodiment, as shown in FIG. 2, FIG. 4 and FIG. 11, a protruding portion 2214 protrudes from the lower cover 221 of the voice assistant device 20. The positive conductive component 2221 and the negative conductive component 2222 of the conductive assembly 222 are exposed out of the protruding portion 2214. A notch 341 is formed on the protecting cover 34 of the extension accessory 30. When the accessory shell 31 is installed on the lower cover 221, the protruding portion 2214 engages with the notch 341. When the accessory shell 31 is rotated relative to the lower cover 221, the lower cover 221 drives the protecting cover 34 to rotate relative to the accessory shell 31 by engagement of the protruding portion 2214 and the notch 341.

Figure 14:
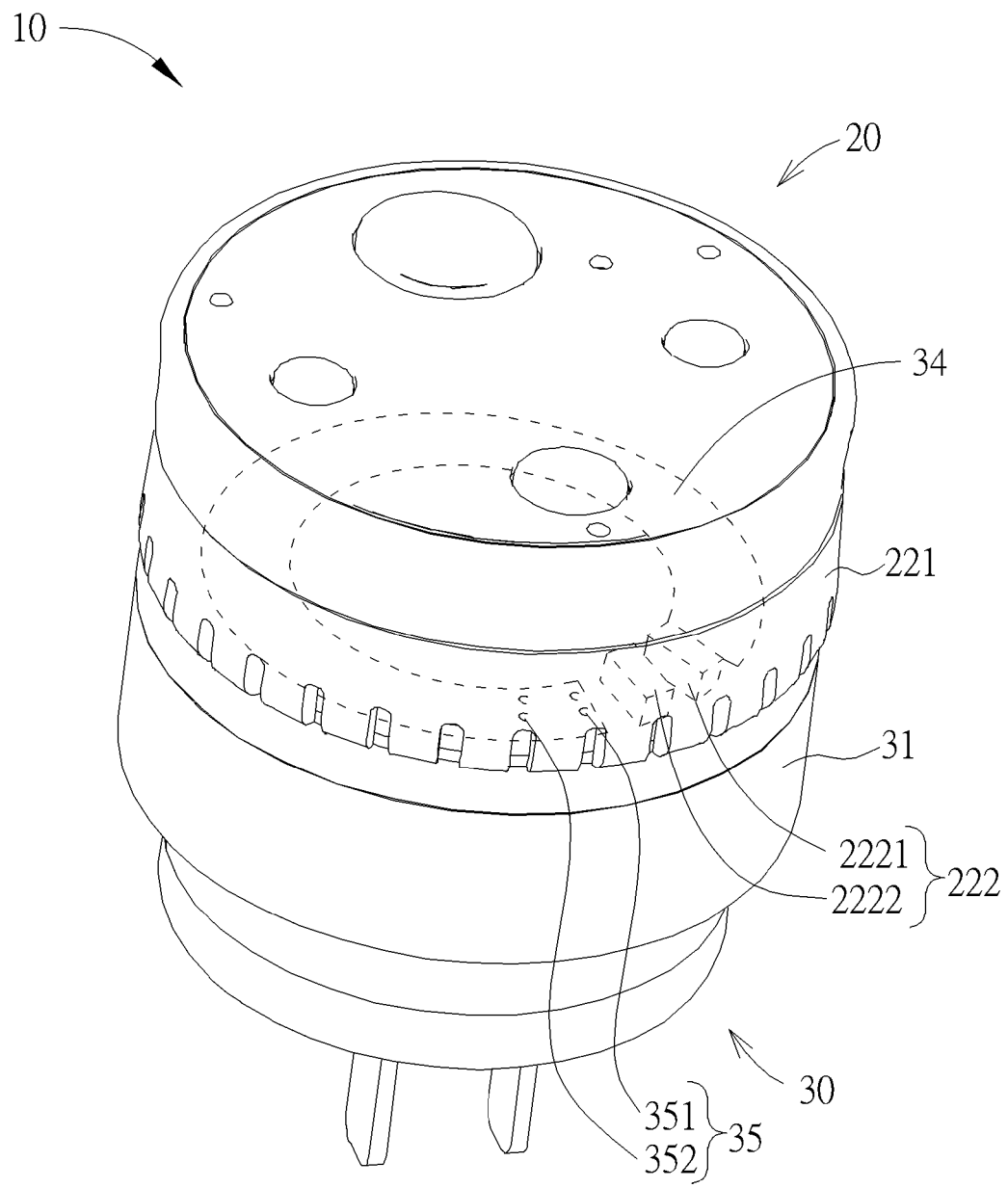
FIG. 14 is a diagram illustrating that an accessory shell is located at a disconnecting position relative to a lower cover according to the first embodiment of the present disclosure.
Figure 15:
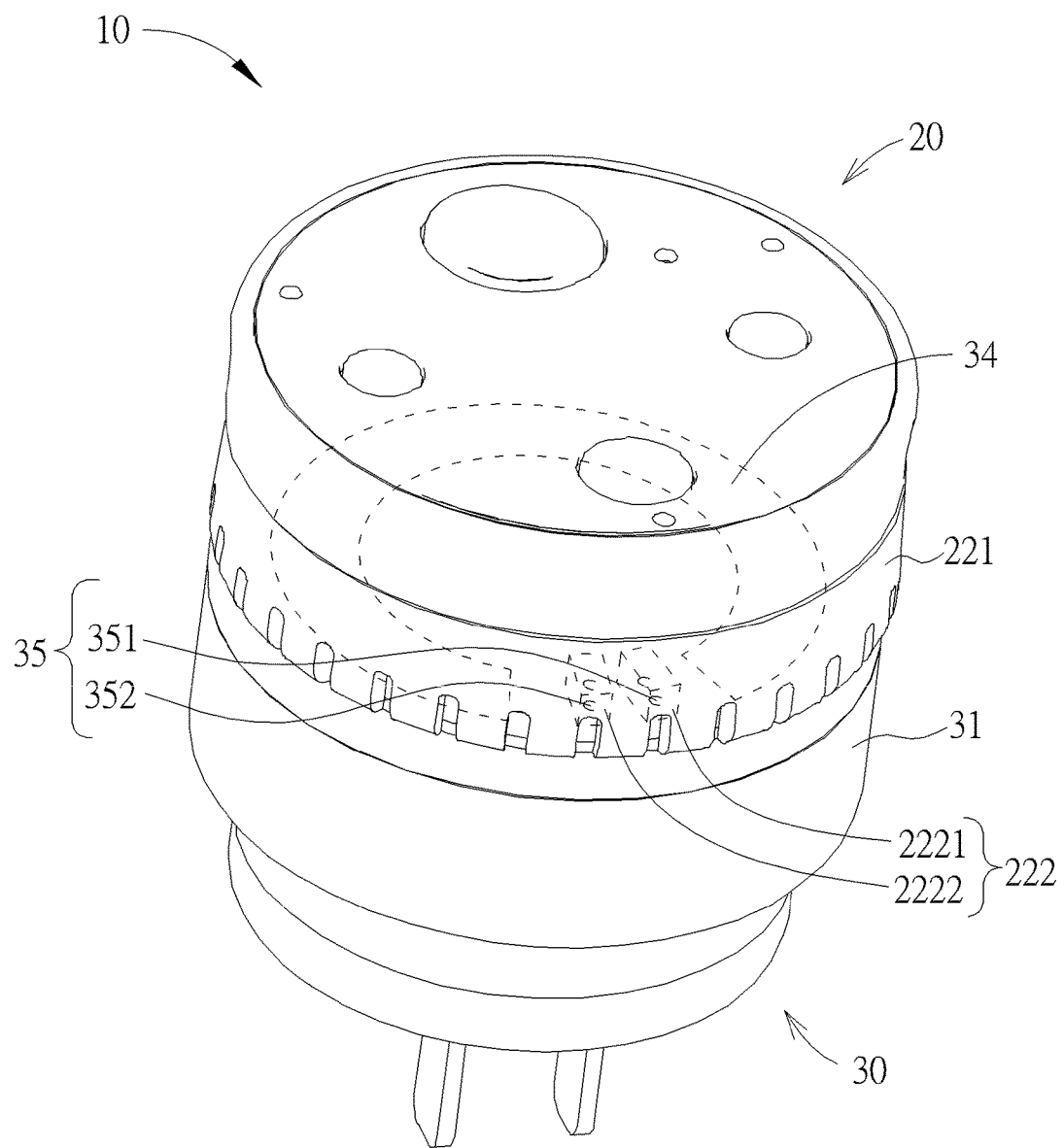
FIG. 15 is a diagram illustrating that the accessory shell is located at a connecting position relative to the lower cover according to the first embodiment of the present disclosure.

Please refer to FIG. 11 to FIG. 15. FIG. 14 is a diagram illustrating that the accessory shell 31 is located at a disconnecting position relative to the lower cover 221 according to the first embodiment of the present disclosure. FIG. 15 is a diagram illustrating that the accessory shell 31 is located at a connecting position relative to the lower cover 221 according to the first embodiment of the present disclosure. As shown in FIG. 14, when the accessory shell 31 is installed on the lower cover 221 and located at the disconnecting position relative to the lower cover 221, the protecting cover 34 covers the accessory positive contact 351 and the accessory negative contact 352 of the connecting assembly 35. Since each of the accessory positive contact 351 and the accessory negative contact 352 may preferably be a pogo pin in this embodiment, the protecting cover 34 can press and cover the accessory positive contact 351 and the accessory negative contact 352 at this moment, so that at least one of the accessory positive contact 351 and the accessory negative contact 352 is not electrically connected to the corresponding conductive component. Therefore, the extension accessory 30 cannot provide the corresponding extension function, such as a power supply function, a light sensing function or a smoke sensing function, for the voice assistant device 20. As shown in FIG. 15, when the accessory shell 31 is installed on the lower cover 221 and rotated to the connecting position relative to the lower cover 221, the lower cover 221 drives the protecting cover 34 to rotate relative to the accessory shell 31 by the engagement of the protruding portion 2214 and notch 341 for exposing the accessory positive contact 351 and the accessory negative contact 352 from the notch 341 to allow the accessory positive contact 351 and the accessory negative contact 352 to be respectively electrically connected to the positive conductive component 2221 and the negative conductive component 2222 of the conductive assembly 222. At this moment, the extension accessory 30 is electrically connected to the voice assistant device 20, and therefore, the extension accessory 30 can provide the corresponding function for the voice assistant device 20.

Figure 16:
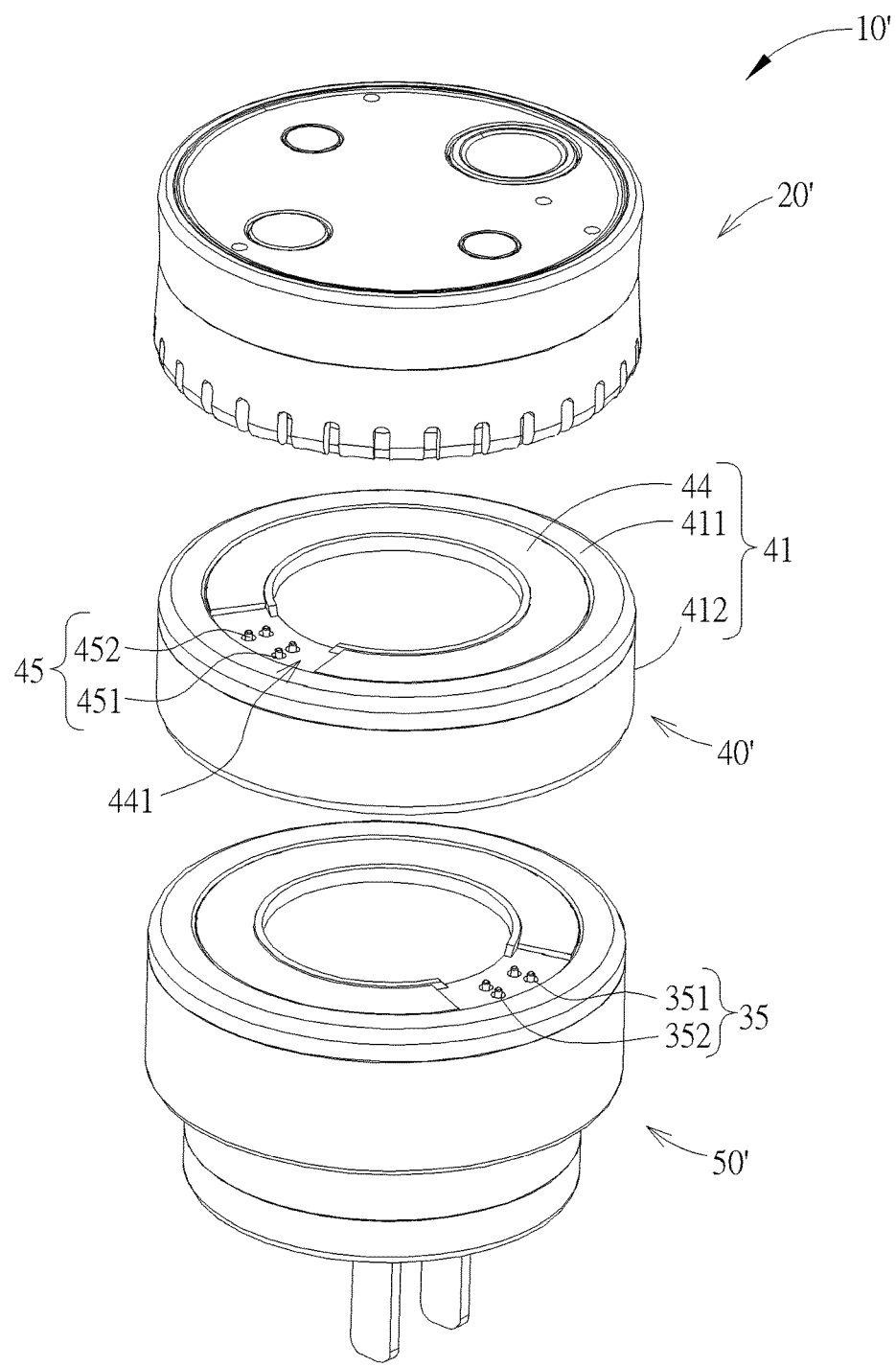
FIG. 16 and FIG. 17 are partial exploded diagrams of a voice assistant system according to a second embodiment of the present disclosure.
Figure 17:
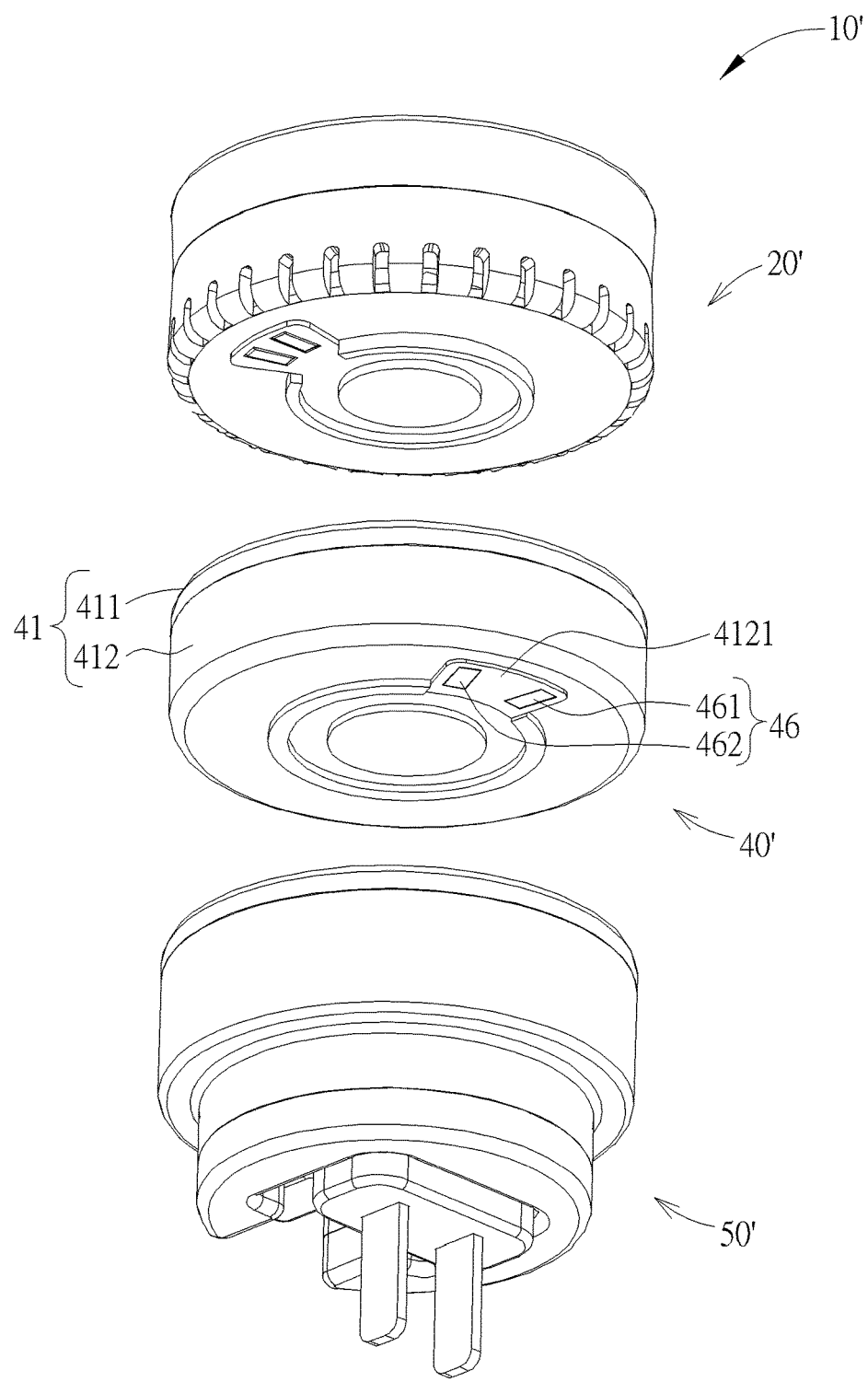
Figure 18:
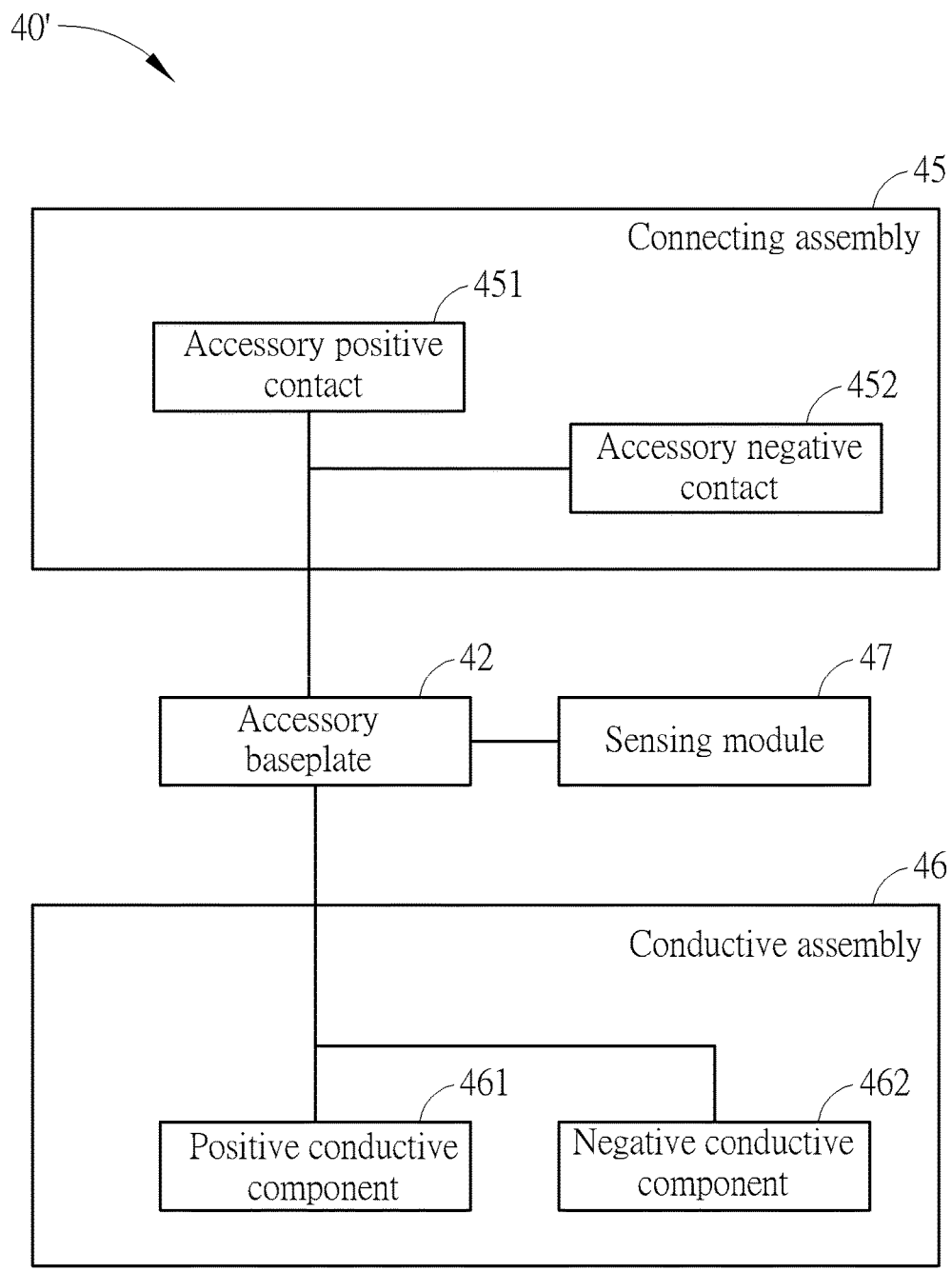
FIG. 18 is a partial function block diagram of a first extension accessory according to the second embodiment of the present disclosure.
Figure 19:
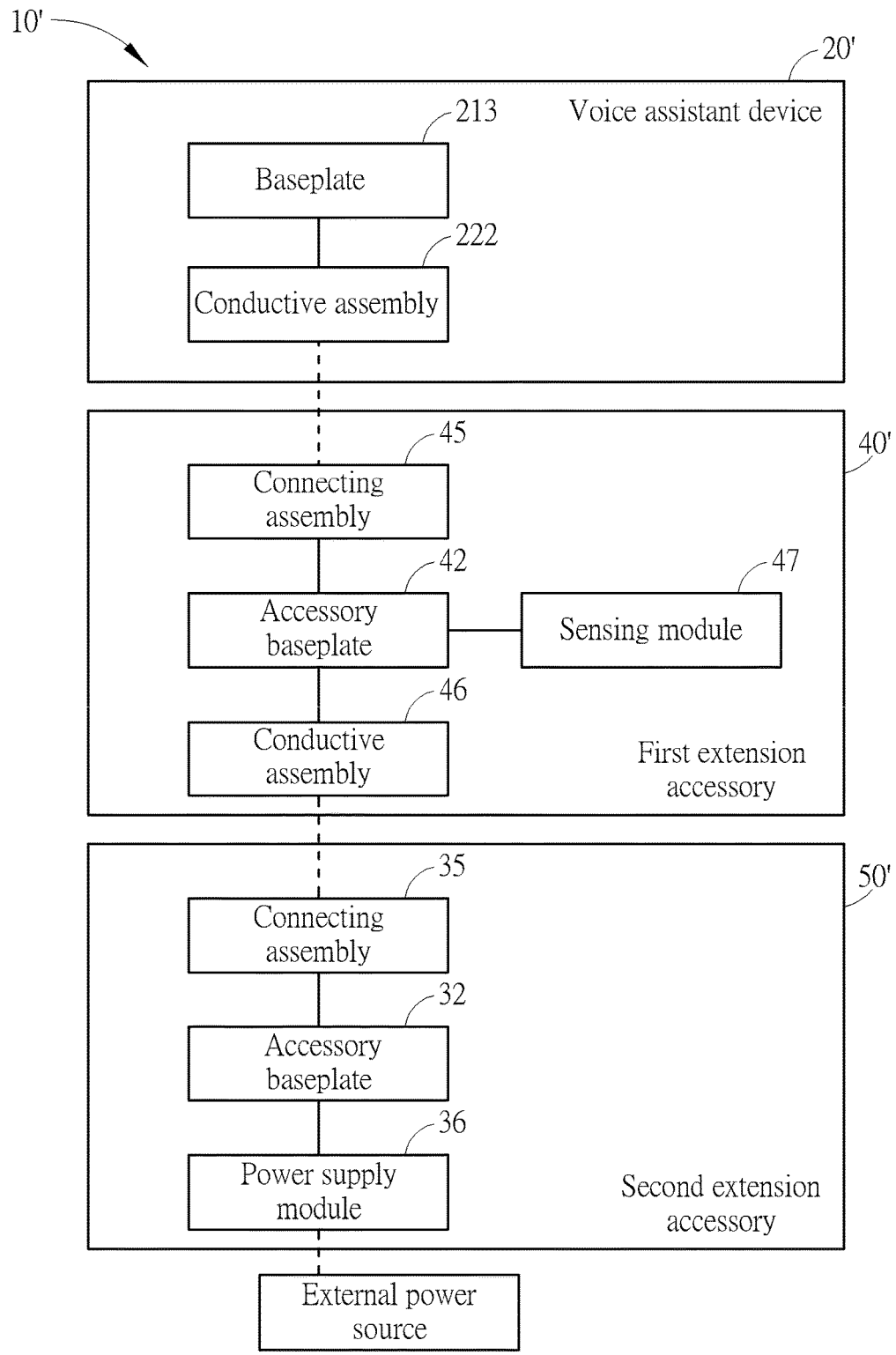
FIG. 19 is a partial functional block diagram of the voice assistant system according to the second embodiment of the present disclosure.

Furthermore, please refer to FIG. 16 to FIG. 19. FIG. 16 and FIG. 17 are partial exploded diagrams of a voice assistant system 10' according to a second embodiment of the present disclosure. FIG. 18 is a partial function block diagram of a first extension accessory 40' according to the second embodiment of the present disclosure. FIG. 19 is a partial functional block diagram of the voice assistant system 10' according to the second embodiment of the present disclosure. As shown in FIG. 16 to FIG. 19, in this embodiment, the voice assistant system 10' includes a voice assistant device 20', the first extension accessory 40' and a second extension accessory 50'. The first extension accessory 40' is installed on the voice assistant device 20'. The second extension accessory 50' is installed on the first extension accessory 40'. The first extension accessory 40' and the second extension accessory 50' can provide different extension functions for the voice assistant device 20'. For example, the first extension accessory 40' may be a sensing accessory including a light sensing module, a smoke sensing module, a temperature sensing module, a moisture sensing module or a pressure sensing module, so as to allow the voice assistant device 20' to execute a corresponding operation according to a sensing result of the sensing accessory. The second extension accessory 50' may be the power supply accessory which can provide the electricity for the voice assistant device 20' and the first extension accessory 40'. The structures of the voice assistant device 20' and the second extension accessory 50' of this embodiment are similar to the structures of the voice assistant device 20 and the extension accessory 30 of the first embodiment. Detailed description for the structures of the voice assistant device 20' and the second extension accessory 50' of this embodiment is omitted herein for simplicity. The first extension accessory 40' includes an accessory shell 41, an accessory baseplate 42, a protecting cover 44, a connecting assembly 45, a conductive assembly 46 and a sensing module 47. The accessory baseplate 42 is electrically connected to the connecting assembly 45, the conductive assembly 46 and the sensing module 47. The accessory shell 41 includes an upper shell part 411 and a lower shell part 412. The connecting assembly 45 includes an accessory positive contact 451 and an accessory negative contact 452. The accessory positive contact 451 and the accessory negative contact 452 are exposed out of the upper shell part 411 of the accessory shell 41 and electrically connected to the accessory baseplate 42 for being respectively electrically connected to the positive conductive component 2221 and the negative conductive component 2222 of the conductive assembly 222 of the voice assistant device 20'. The protecting cover 44 is rotatably disposed on the upper shell part 411 of the accessory shell 41. A notch 441 is formed on the protecting cover 44 for selectively revealing or concealing the accessory positive contact 451 and the accessory negative contact 452 of the connecting assembly 45. The conductive assembly 46 includes a positive conductive component 461 and a negative conductive component 462. A protruding portion 4121 protrudes from the lower shell part 412 of the accessory shell 41. The positive conductive component 461 and the negative conductive component 462 are exposed out of the protruding portion 4121 and for being respectively electrically connected to the accessory positive contact 351 and the accessory negative contact 352 of the connecting assembly 35 of the second extension accessory 50'. In other words, in this embodiment, when the first extension accessory 40' is installed on the voice assistant device 20', the lower cover 221 of the voice assistant device 20' drives the protecting cover 44 to rotate relative to the accessory shell 41 by engagement of the protruding portion 2214 and the notch 441 for revealing the accessory positive contact 451 and the accessory negative contact 452 from the notch 441 to allow the accessory positive contact 451 and the accessory negative contact 452 to be respectively electrically connected to the positive conductive component 2221 and the negative conductive component 2222 of the conductive assembly 222 of the voice assistant device 20'. Furthermore, when the second extension accessory 50' is installed on the first extension accessory 40', the lower shell part 412 of the accessory shell 41 can drive the protecting cover 34 to rotate relative to the accessory shell 31 by engagement of the protruding portion 4121 and the notch 341 for revealing the accessory positive contact 351 and the accessory negative contact 352 from the notch 341 to allow the accessory positive contact 351 and the accessory negative contact 352 be respectively electrically connected to the positive conductive component 461 and the negative conductive component 462 of the conductive assembly 46 of the first extension accessory 40'. In such a way, the first extension accessory 40' and the second extension accessory 50' can be electrically connected to the voice assistant device 20' at the same time for providing different corresponding extension functions for the voice assistant device 20'.

Figure 20:
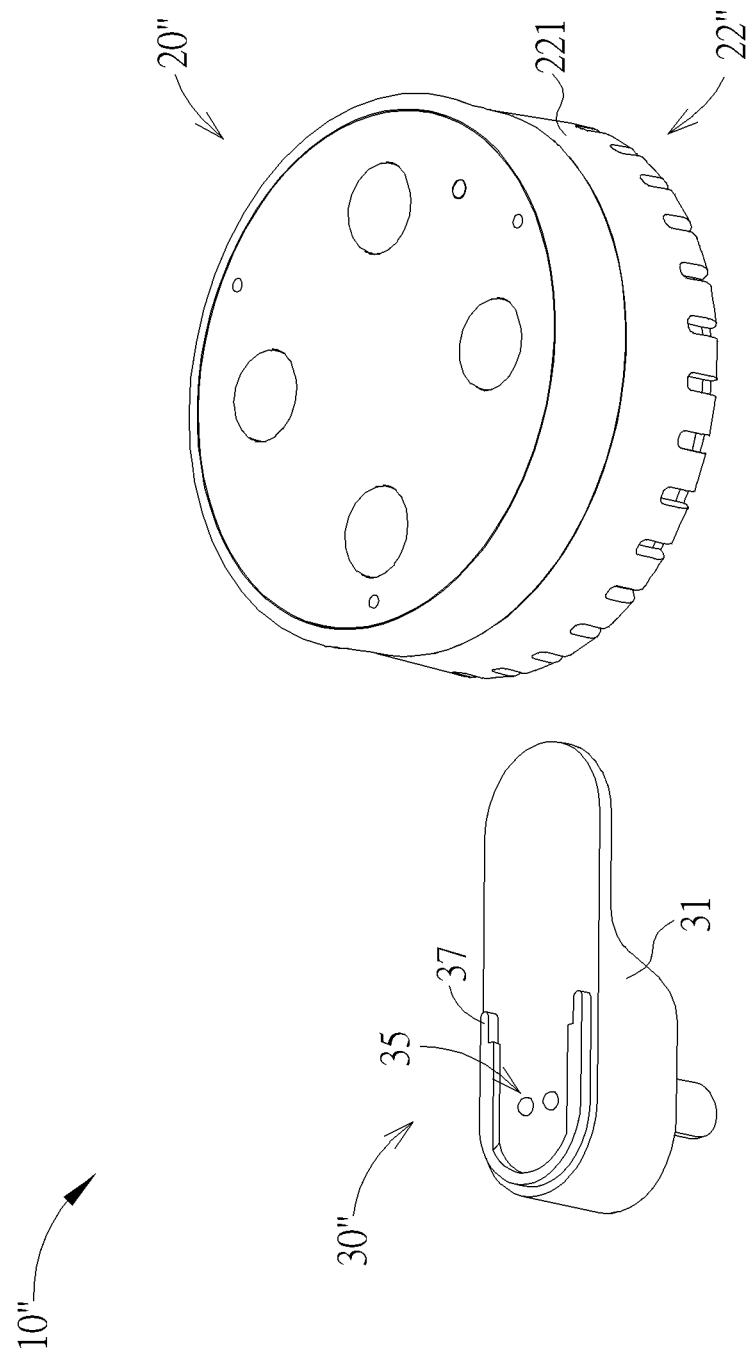
FIG. 20 and FIG. 21 are partial exploded diagrams of a voice assistant system at different views according to a third embodiment of the present disclosure.
Figure 21:
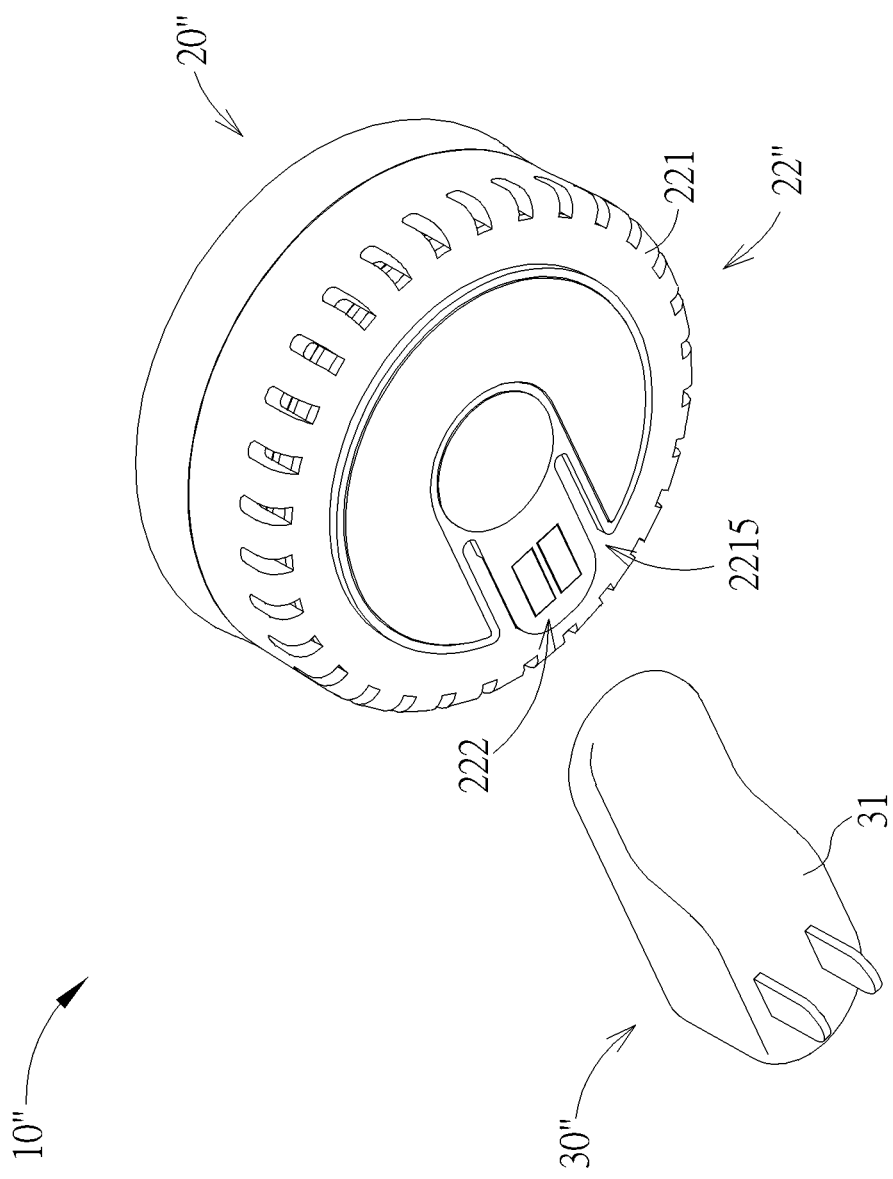

Besides, the combining mechanism of the voice assistant device and the extension accessory is not limited to this embodiment. For example, please refer to FIG. 20 and FIG. 21. FIG. 20 and FIG. 21 are partial exploded diagrams of a voice assistant system 10" at different views according to a third embodiment of the present disclosure. As shown in FIG. 20 and FIG. 21, different from the first embodiment, a second assembling module 22" of a voice assistant device 20" of the voice assistant system 10" of this embodiment further includes a first sliding component 2215 disposed on the lower cover 221. An extension accessory 30" of the voice assistant system 10" further includes a second sliding component 37 disposed on the accessory shell 31. The accessory shell 31 is detachably installed on the lower cover 221 and slidable relative to the lower cover 221 by cooperation of the first sliding component 2215 and the second sliding component 37. When the accessory shell 31 is installed on the lower cover 221 and slides relative to the lower cover 221 to the connecting position, the connecting assembly 35 is electrically connected to the conductive assembly 222. When the accessory shell 31 slides relative to the lower cover 221 to leave for another position, such as the disconnecting position, from the connecting position, the connecting assembly 35 is not electrically connected to the conductive component 222.

Figure 22:
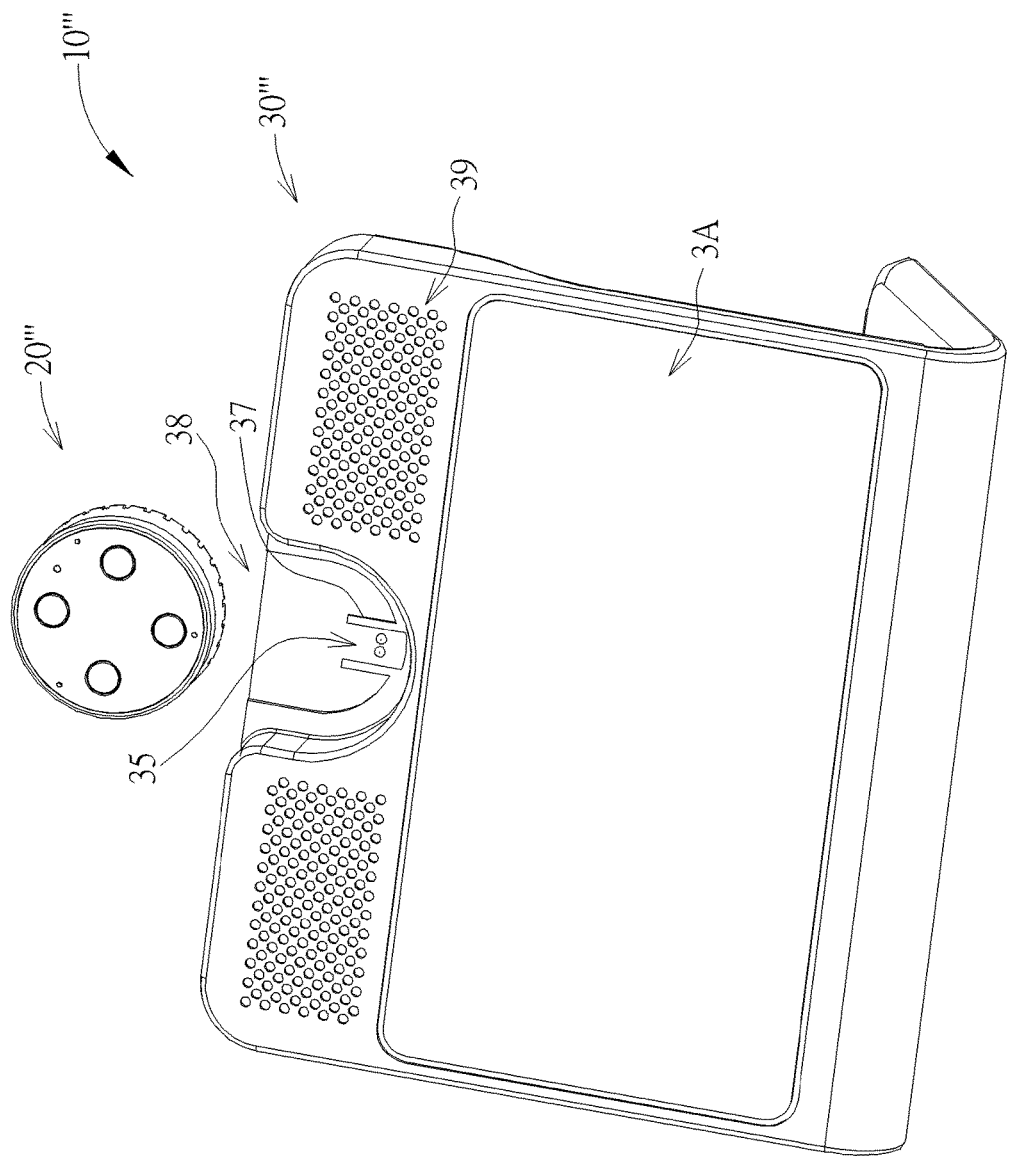
FIG. 22 and FIG. 23 are partial exploded diagrams of a voice assistant system at different views according to a fourth embodiment of the present disclosure.
Figure 23:
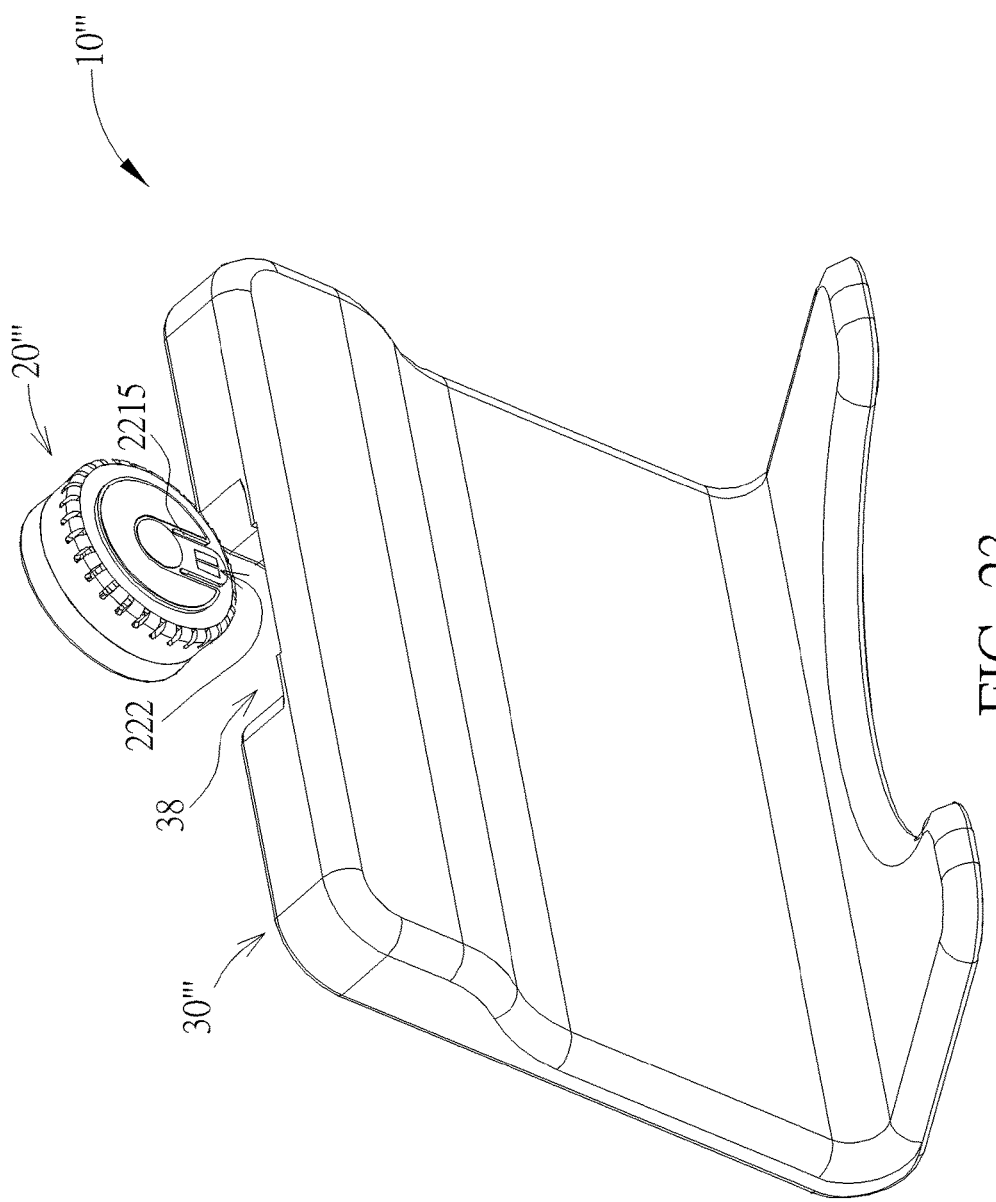
Figure 24:
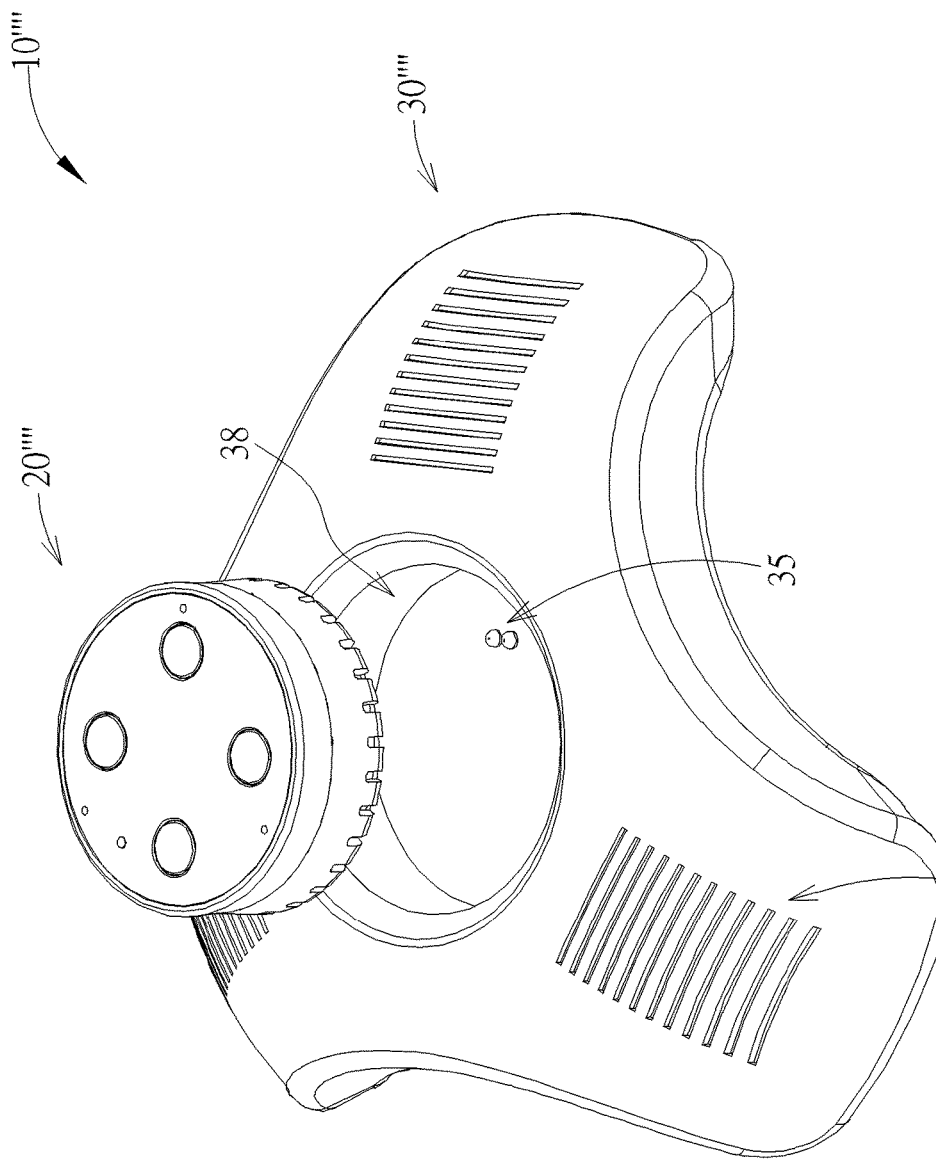
FIG. 24 and FIG. 25 are partial exploded diagrams of a voice assistant system at different views according to a fifth embodiment of the present disclosure.
Figure 25:
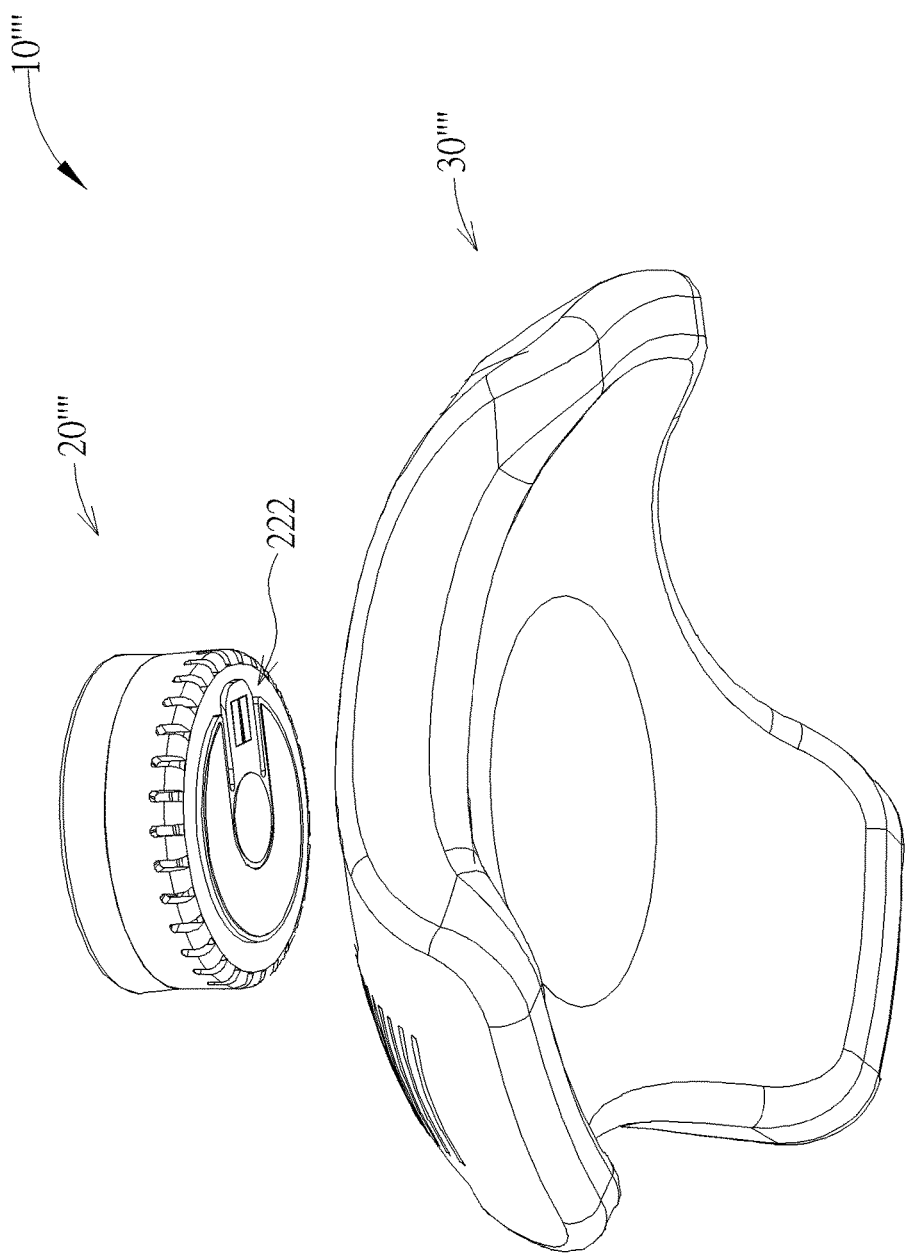
Figure 26:
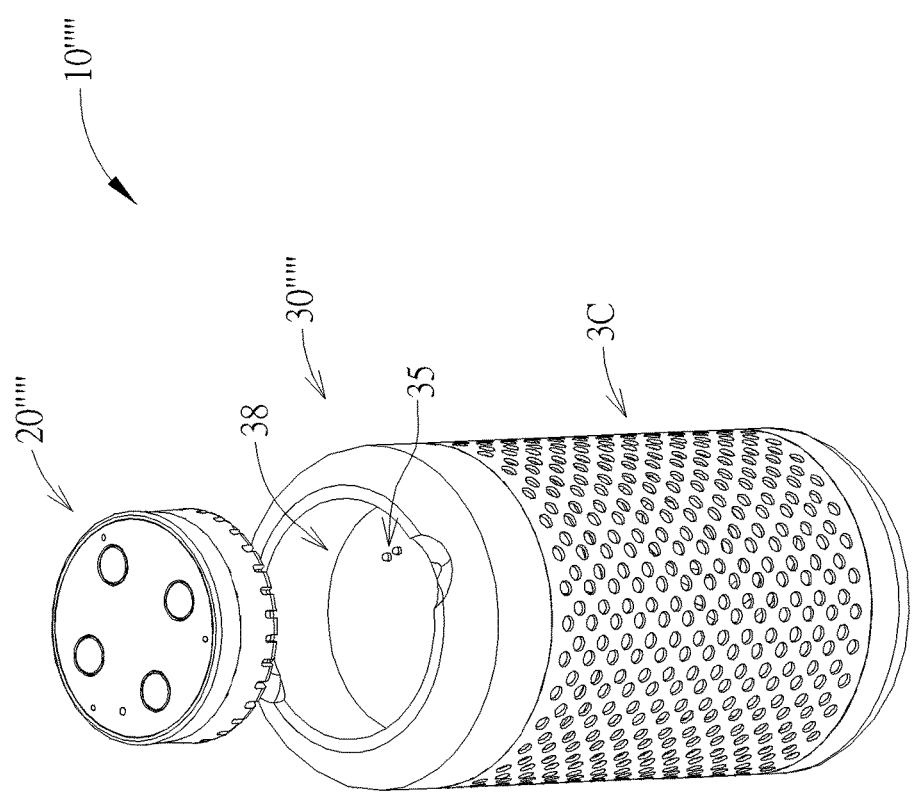

Furthermore, please refer to FIG. 22 to FIG. 27. FIG. 22 and FIG. 23 are partial exploded diagrams of a voice assistant system 10''' at different views according to a fourth embodiment of the present disclosure. FIG. 24 and FIG. 25 are partial exploded diagrams of a voice assistant system 10'''' at different views according to a fifth embodiment of the present disclosure. FIG. 26 and FIG. 27 are partial exploded diagrams of a voice assistant system 10 at different views according to a sixth embodiment of the present disclosure. As shown in FIG. 22 and FIG. 23, a voice assistant device 20''' of the voice assistant system 10''' of this embodiment is similar to the voice assistant device 20" of the third embodiment. Detailed description for the voice assistant device 20''' is omitted herein for simplicity. An extension accessory 30''' of the voice assistant system 10''' may be a video calling accessory including a video calling module and the power supply module 36, which is not shown in the figures. The video calling module includes a speaker module 39 for outputting sound signals and a display module 3A for outputting image signals. A combining chamber 38 is formed on the video calling accessory. The video calling accessory further includes the second sliding component 37 and the connecting assembly 35 disposed inside the combining chamber 38. When the voice assistant device 20''' is slidably installed inside the combining chamber 38 on the video calling accessory, the conductive assembly 222 of the voice assistant device 20''' is electrically connected to the connecting assembly 35 of the video calling accessory, so that the voice assistant device 20''' can transmit the image signals and the sound signals by the video calling module of the video calling accessory. Furthermore, the video calling accessory can provide the electricity for the voice assistant device 20''' by the power supply module 36. As shown in FIG. 24 and FIG. 25, a voice assistant device 20'''' of the voice assistant system 10'''' of this embodiment is similar to the voice assistant device 20''' of the third embodiment. Detailed description for the voice assistant device 20'''' is omitted herein for simplicity. An extension accessory 30'''' of the voice assistant system 10'''' may be a voice calling accessory including a voice calling module and the power supply module 36, which is not shown in the figures. The voice calling module includes a speaker module 3B for outputting the sound signals. The combining chamber 38 is formed on the voice calling accessory. The voice calling accessory further includes the connecting assembly 35 disposed inside the combining chamber 38. When the voice assistant device 20'''' is installed inside the combining chamber 38 on the voice calling accessory, the conductive assembly 222 of the voice assistant device 20'''' is electrically connected to the connecting assembly 35 of the voice calling accessory, so that the voice assistant device 20'''' can transmit the sound signals by the voice calling module of the voice calling accessory. Furthermore, the voice calling accessory can provide the electricity for the voice assistant device 20'''' by the power supply module 36. As shown in FIG. 26 and FIG. 27, a voice assistant device 20'''''' of the voice assistant system 10'''''' of this embodiment is similar to the voice assistant device 20''' of the third embodiment. Detailed description for the voice assistant device 20'''''' is omitted herein for simplicity. An extension accessory 30'''''' of the voice assistant system 10'''''' may be a speaker accessory including a speaker module 3C for outputting the sound signals and the power supply module 36, which is not shown in the figures. The combining chamber 38 is formed on the speaker accessory. The speaker accessory further includes the connecting assembly 35 disposed inside the combining chamber 38. When the voice assistant device 20'''''' is installed inside the combining chamber 38 on the voice calling accessory, the conductive assembly 222 of the voice assistant device 20'''''' is electrically connected to the connecting assembly 35 of the speaker accessory, so that the voice assistant device 20'''''' can transmit the sound signals by the speaker module 3C of the speaker accessory. Furthermore, the speaker accessory can provide the electricity for the voice assistant device 20'''''' by the power supply module 36.

In contrast to the prior art, the voice assistant device of the present disclosure can be powered on or powered off by relative rotation of the first assembling module and the second assembling module. When the lower cover is rotated relative to the upper cover to the power-on position, the power source assembly is electrically connected to the baseplate by the conductive assembly, so as to provide the electricity for the baseplate to switch the voice assistant device to a power-on state. When the lower cover is rotated relative to the upper cover to the power-off position, the power source assembly is not electrically connected to the baseplate, so as not to provide the electricity for the baseplate to switch the voice assistant device to a power-off state, which facilitates a user to detach the first assembling module and the second assembling module from each other for maintenance, such as battery replacement. Therefore, it brings convenience in use. Furthermore, the voice assistant device of the present disclosure can be combined with the extension accessory to form the voice assistant system. When the extension accessory is installed on the voice assistant device, the extension accessory is electrically connected to the voice assistant device to provide the corresponding extension function, such as a power supply function, a light sensing function or a smoke sensing function for the voice assistant device. In other words, the voice assistant system with such modular design can satisfy different use demands by installing different extension accessories with different extension functions on the voice assistant device. Therefore, it is flexible in use.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A voice assistant device capable of being powered on or powered off by relative rotation of different modules, the voice assistant device comprising:
   a first assembling module comprising an upper cover, a power source assembly and a baseplate, the power source assembly and the baseplate being disposed on the upper cover, the power source assembly comprising a power positive contact and a power negative contact, the baseplate comprising a base positive contact and a base negative contact, the power positive contact, the power negative contact, the base positive contact and the base negative contact being exposed out of the upper cover; and
   a second assembling module comprising a lower cover and a conductive assembly disposed on the lower cover, the lower cover being detachably installed on the upper cover and rotatable relative to the upper cover, the conductive assembly comprising a positive conductive component and a negative conductive component;
   wherein the positive conductive component contacts with the power positive contact and the base positive contact in response to a first condition that the lower cover is rotated relative to the upper cover to a power-on position, and the negative conductive component contacts with the power negative contact and the base negative contact in response to the first condition that the lower cover is rotated relative to the upper cover to the power-on position, so that the power source assembly is electrically connected to the baseplate by the conductive assembly, so as to provide electricity for the baseplate in response to the first condition that the lower cover is rotated relative to the upper cover to the power-on position, and the positive conductive component does not contact with at least one of the power positive contact and the base positive contact in response to a second condition that the lower cover is rotated relative to the upper cover to a power-off position, and the negative conductive component does not contact with at least one of the power negative contact and the base negative contact in response to the second condition that the lower cover is rotated relative to the upper cover to the power-off position, so that the power source assembly is not electrically connected to the baseplate, so as not to provide the electricity for the baseplate in response to the second condition that the lower cover is rotated relative to the upper cover to the power-off position.

2. The voice assistant device of claim 1, wherein each of the power positive contact, the power negative contact, the base positive contact and the base negative contact is a pogo pin, and each of the positive conductive component and the negative conductive component is a metal plate.

3. The voice assistant device of claim 2, wherein a platform protrudes from the lower cover, a chamfer part is formed on an outer periphery of the platform, the positive conductive component and the negative conductive component are disposed on the platform;
   wherein the power positive contact and the base positive contact are forced by the positive conductive component to retract in response to a condition that the power positive contact and the base positive contact cross over the chamfer part to contact with the positive conductive component; and
   the power negative contact and the base negative contact are forced by the negative conductive component to retract in response to a condition that the power negative contact and the base negative contact cross over the chamfer part to contact with the negative conductive component.

4. The voice assistant device of claim 1, wherein an L-shaped recess is formed on the upper cover, a protrusion is formed on the lower cover, and the lower cover is detachably installed on the upper cover by cooperation of the protrusion and the L-shaped recess.

5. The voice assistant device of claim 4, wherein the L-shaped recess comprises a first segment, a second segment, an open end, a turning end and an abutting end, the first segment is communicated with the open end and the turning end, the first segment extends along a direction substantially perpendicular to a rotating direction of the lower cover relative to the upper cover, the second segment is communicated with the turning end and the abutting end, the second segment extends along a direction substantially parallel to the rotating direction of the lower cover relative to the upper cover;
   wherein the protrusion abuts against the abutting end in response to the first condition that the lower cover is rotated relative to the upper cover to the power-on position; and
   the protrusion abuts against the turning end in response to the second condition that the lower cover is rotated relative to the upper cover to the power-off position.

6. The voice assistant device of claim 1, wherein the first assembling module further comprises at least one first positioning magnetic component, the second assembling module further comprises at least one second positioning magnetic component, and the at least one first positioning magnetic component and the at least one second positioning magnetic component magnetically attract each other to facilitate to position the upper cover relative to the lower cover.

7. The voice assistant device of claim 1, wherein the first assembling module further comprises a microphone assembly electrically connected to the baseplate, the microphone assembly comprises an analog microphone and two digital microphones, the analog microphone and the two digital microphones are arranged in a regular triangle, and the baseplate comprises a base controller configured to control the two digital microphones to be powered on when receiving a signal transmitted from the analog microphone.

8. The voice assistant device of claim 1, wherein the power source assembly includes a battery holder configured to accommodate at least one dry-cell battery.

9. The voice assistant device of claim 1, wherein a chamber is formed on the upper cover, and the first assembling module further comprises a speaker assembly disposed inside the chamber.

10. A voice assistant system comprising:
a voice assistant device comprising:
a first assembling module comprising an upper cover, a power source assembly and a baseplate, the power source assembly and the baseplate being disposed on the upper cover; and
a second assembling module comprising a lower cover and a conductive assembly disposed on the lower cover, the lower cover being detachably installed on the upper cover and rotatable relative to the upper cover, wherein the power source assembly is electrically connected to the baseplate by the conductive assembly, so as to provide electricity for the baseplate in response to a first condition that the lower cover is rotated relative to the upper cover to a power-on position, and the power source assembly is not electrically connected to the baseplate, so as not to provide the electricity for the baseplate in response to a second condition that the lower cover is rotated relative to the upper cover to a power-off position; and
an extension accessory detachably installed on the voice assistant device, the extension accessory being electrically connected to the voice assistant device to provide a corresponding extension function for the voice assistant device when the extension accessory is installed on the voice assistant device, the extension accessory comprising an accessory shell, an accessory baseplate, a protecting cover and a connecting assembly, the accessory shell being detachably installed on the lower cover, the accessory baseplate being disposed on the accessory shell, the connecting assembly being exposed out of the accessory shell and electrically connected to the accessory baseplate, the protecting cover being rotatably disposed on the accessory shell to selectively conceal or reveal the connecting assembly and engaging with the lower cover in response to a condition that the accessory shell is installed on the lower cover, the lower cover driving the protecting cover to rotate relative to the accessory shell to reveal the connecting assembly, so that the conductive assembly is electrically connected to the connecting assembly and the accessory baseplate to allow the power source assembly to be electrically connected to the accessory baseplate by the conductive assembly, so as to provide the electricity for the accessory baseplate in response to a connecting condition that the accessory shell is installed on the lower cover and located at a connecting position, and the lower cover driving the protecting cover to rotate relative to the accessory shell to conceal the connecting assembly, so that the conductive assembly is not electrically connected to the connecting assembly and the accessory baseplate, so as not to provide the electricity for the accessory baseplate in response to a disconnecting condition that the accessory shell is installed on the lower cover and located at a disconnecting position.

11. The voice assistant system of claim 10, wherein a notch is formed on the protecting cover, a protruding portion protrudes from the lower cover, and the protecting cover engages with the lower cover by engagement of the notch and the protruding portion in response to the condition that the accessory shell is installed on the lower cover.

12. The voice assistant system of claim 11, wherein the conductive assembly is exposed out of the protruding portion, the connecting assembly is exposed out of the notch, so as to be electrically connected to the conductive assembly in response to the connecting condition that the accessory shell is installed on the lower cover and located at the connecting position; and
the connecting assembly is concealed by the protecting cover, so as not to be electrically connected to the conductive assembly in response to the disconnecting condition that the accessory shell is installed on the lower cover and located at the disconnecting position.

13. The voice assistant system of claim 10, wherein the connecting assembly comprises an accessory positive contact and an accessory negative contact, the conductive assembly comprises a positive conductive component and a negative conductive component;
wherein the accessory positive contact and the accessory negative contact respectively contact with the positive conductive component and the negative conductive component in response to the connecting condition that the accessory shell is installed on the lower cover and located at the connecting position; and
the accessory positive contact and the accessory negative contact do not respectively contact with the positive conductive component and the negative conductive component in response to the disconnecting condition that the accessory shell is installed on the lower cover and located at the disconnecting position.

14. The voice assistant system of claim 13, wherein each of the accessory positive contact and the accessory negative contact is a pogo pin, and each of the positive conductive component and the negative conductive component is a metal plate.

15. The voice assistant system of claim 10, wherein the second assembling module further comprises a first sliding component disposed on the lower cover, the extension accessory further comprises a second sliding component disposed on the accessory shell, the accessory shell is detachably and slidably installed on the lower cover by cooperation of the first sliding component and the second sliding component.

16. The voice assistant system of claim 15, wherein the extension accessory further comprises a connecting assembly;
wherein the connecting assembly is electrically connected to the conductive assembly in response to the connecting condition that the accessory shell is installed on the lower cover and located at the connecting position; and
the connecting assembly is not electrically connected to the conductive assembly in response to the disconnecting condition that the accessory shell is installed on the lower cover and located at the disconnecting position.

17. The voice assistant system of claim 10, wherein the extension accessory further comprises a power supply module electrically to the accessory baseplate, the second assembling module further comprises a power source controller electrically connected to the conductive assembly, the baseplate and the power source assembly, and the power source controller controls an external power source to provide the electricity for the baseplate in response to a condition that the power source controller determines the baseplate is electrically connected to the external power source by the conductive assembly, the accessory baseplate and the power supply module.

18. The voice assistant system of claim 10, wherein the second assembling module further comprises a first connecting magnetic component disposed on the lower cover, the extension accessory further comprises a second connecting magnetic component disposed on the accessory shell, the first connecting magnetic component and the second connecting magnetic component magnetically attract each other when the accessory shell is installed on the lower cover.

19. The voice assistant system of claim 10, wherein the extension accessory further comprises a speaker module electrically connected to the accessory baseplate, the conductive assembly is electrically connected to the accessory baseplate to allow the voice assistant device to output a voice signal to the speaker module in response to the connecting condition that the accessory shell is installed on the lower cover and located at the connecting position.

20. The voice assistant system of claim 10, wherein the extension accessory further comprises a sensing module electrically connected to the accessory baseplate, and the conductive assembly is electrically connected to the accessory baseplate to allow the voice assistant device to execute a corresponding operation according to a sensing result of the sensing module in response to the connecting condition that the accessory shell is installed on the lower cover and located at the connecting position.

21. The voice assistant system of claim 10, wherein the power source assembly comprises a power positive contact and a power negative contact, the baseplate comprises a base positive contact and a base negative contact, the power positive contact, the power negative contact, the base positive contact and the base negative contact are exposed out of the upper cover, and the conductive assembly comprises a positive conductive component and a negative conductive component;

wherein the positive conductive component contacts with the power positive contact and the base positive contact in response to the first condition that the lower cover is rotated relative to the upper cover to the power-on position, and the negative conductive component contacts with the power negative contact and the base negative contact in response to the first condition that the lower cover is rotated relative to the upper cover to the power-on position; and the positive conductive component does not contact with the power positive contact or the base positive contact in response to the second condition that the lower cover is rotated relative to the upper cover to the power-off position, and the negative conductive component does not contact with the power negative contact or the base negative contact in response to the second condition that the lower cover is rotated relative to the upper cover to the power-off position.

22. The voice assistant system of claim 21, wherein each of the power positive contact, the power negative contact, the base positive contact and the base negative contact is a pogo pin, and each of the positive conductive component and the negative conductive component is a metal plate.

23. A voice assistant device capable of being powered on or powered off by relative rotation of different modules, the voice assistant device comprising:

a first assembling module comprising an upper cover, a power source assembly and a baseplate, the power source assembly and the baseplate being disposed on the upper cover, an L-shaped recess being formed on the upper cover, the L-shaped recess comprising a first segment, a second segment, an open end, a turning end and an abutting end, the first segment being communicated with the open end and the turning end, the second segment being communicated with the turning end and the abutting end; and a second assembling module comprising a lower cover and a conductive assembly disposed on the lower cover, a protrusion being formed on the lower cover, the lower cover being detachably installed on the upper cover and rotatable relative to the upper cover by cooperation of the protrusion and the L-shaped recess, the first segment extending along a direction substantially perpendicular to a rotating direction of the lower cover relative to the upper cover, the second segment extending along a direction substantially parallel to the rotating direction of the lower cover relative to the upper cover;

wherein the power source assembly is electrically connected to the baseplate by the conductive assembly, so as to provide electricity for the baseplate in response to a first condition that the lower cover is rotated relative to the upper cover to a power-on position, and the power source assembly is not electrically connected to the baseplate, so as not to provide the electricity for the baseplate in response to a second condition that the lower cover is rotated relative to the upper cover to a power-off position;

wherein the protrusion abuts against the abutting end in response to the first condition that the lower cover is rotated relative to the upper cover to the power-on position, and the protrusion abuts against the turning end in response to the second condition that the lower cover is rotated relative to the upper cover to the power-off position.

24. A voice assistant system comprising:

a voice assistant device comprising:

a first assembling module comprising an upper cover, a power source assembly and a baseplate, the power source assembly and the baseplate being disposed on the upper cover, the power source assembly comprising a power positive contact and a power negative contact, the baseplate comprising a base positive contact and a base negative contact, and the power positive contact, the power negative contact, the base positive contact and the base negative contact being exposed out of the upper cover; and a second assembling module comprising a lower cover and a conductive assembly disposed on the lower cover, the lower cover being detachably installed on the upper cover and rotatable relative to the upper cover, the conductive assembly comprising a positive conductive component and a negative conductive component, wherein the positive conductive component contacts with the power positive contact and the base positive contact in response to a first condition that the lower cover is rotated relative to the upper cover to a power-on position, and the negative conductive component contacts with the power negative contact and the base negative contact in response to the first condition that the lower cover is rotated relative to the upper cover to the power-on position, so that the power source assembly is electrically connected to the baseplate by the conductive assembly, so as to provide electricity for the baseplate in response to the first condition that the lower cover is rotated relative to the upper cover to the power-on position, and the positive conductive component does not contact with at least one of the power positive contact and the base positive contact in response to a second condition that the lower cover is rotated relative to the upper cover to a power-off position, and the negative conductive component does not contact with at least one of the power negative contact and the base negative contact in response to the second condition that the lower cover is rotated relative to the upper cover to the power-off position, so that the power source assembly is not electrically connected to the baseplate, so as not to provide the electricity for the baseplate in response to the second condition that the lower cover is rotated relative to the upper cover to the power-off position; and an extension accessory detachably installed on the voice assistant device, the extension accessory being electrically connected to the voice assistant device to provide a corresponding extension function for the voice assistant device when the extension accessory is installed on the voice assistant device.

25. The voice assistant system of claim 24, wherein each of the power positive contact, the power negative contact, the base positive contact and the base negative contact is a pogo pin, and each of the positive conductive component and the negative conductive component is a metal plate.

* * * * *